(12) United States Patent
Maruta et al.

(10) Patent No.: US 8,723,998 B2
(45) Date of Patent: May 13, 2014

(54) SOLID-STATE IMAGE PICKUP DEVICE

(75) Inventors: Masanao Maruta, Kanagawa (JP);
Mitsuo Magane, Kanagawa (JP)

(73) Assignee: Renesas Electronics Corporation,
Kanagawa (JP)

( * ) Notice: Subject to any disclaimer, the term of this patent is extended or adjusted under 35 U.S.C. 154(b) by 124 days.

(21) Appl. No.: 13/542,442

(22) Filed: Jul. 5, 2012

(65) Prior Publication Data
US 2013/0016260 A1 Jan. 17, 2013

(30) Foreign Application Priority Data

Jul. 15, 2011 (JP) ................................ 2011-156837

(51) Int. Cl.
*H04N 5/378* (2011.01)

(52) U.S. Cl.
USPC .......................................... 348/294; 341/164

(58) Field of Classification Search
USPC .......................................... 348/294; 341/164
See application file for complete search history.

(56) References Cited

U.S. PATENT DOCUMENTS

| | | | |
|---|---|---|---|
| 6,344,877 B1 * | 2/2002 | Gowda et al. | 348/245 |
| 2005/0206548 A1 * | 9/2005 | Muramatsu et al. | 341/172 |
| 2007/0229687 A1 * | 10/2007 | Hiyama et al. | 348/294 |
| 2009/0027533 A1 * | 1/2009 | Itakura et al. | 348/308 |
| 2009/0251578 A1 * | 10/2009 | Yamashita | 348/302 |
| 2009/0278969 A1 * | 11/2009 | Hisamatsu | 348/308 |
| 2010/0182448 A1 | 7/2010 | Takahashi | |
| 2011/0001039 A1 * | 1/2011 | Hoshino | 250/208.1 |
| 2011/0080507 A1 * | 4/2011 | Iwasa | 348/302 |
| 2012/0013493 A1 * | 1/2012 | Kato | 341/120 |
| 2012/0176518 A1 * | 7/2012 | Yamazaki et al. | 348/241 |
| 2012/0261552 A1 * | 10/2012 | Ikeda | 250/208.1 |
| 2013/0002914 A1 * | 1/2013 | Koyama | 348/294 |
| 2013/0146751 A1 * | 6/2013 | Hagihara | 250/208.1 |

FOREIGN PATENT DOCUMENTS

| | | |
|---|---|---|
| JP | 2008-283457 | 11/2008 |
| JP | 2009-130827 | 6/2009 |
| JP | 2010-166449 | 7/2010 |

* cited by examiner

*Primary Examiner* — James Hannett
*Assistant Examiner* — Abdelaaziz Tissire
(74) *Attorney, Agent, or Firm* — McDermott Will Emery LLP

(57) ABSTRACT

A solid-state image pickup device includes plural pixels, a voltage generator that generates a reference voltage, plural comparators that are aligned in one direction, and compare respective voltages output from the pixels with the reference voltage, a counter that counts in tandem with a change in the reference voltage generated by the voltage generator, plural buffer circuits that are connected in series with the counter, and each sequentially receives an output of the counter; plural latch circuits that take in a value input to an input terminal thereof according to respective trigger signals output from the comparators, a common signal line that is commonly connected to respective inputs of the latch circuits, and plural signal lines that are connected to respective outputs of the buffer circuits, and allow the output of the counter to propagate therethrough.

8 Claims, 18 Drawing Sheets

SOLID-STATE IMAGE PICKUP DEVICE

CROSS-REFERENCE TO RELATED APPLICATIONS

The disclosure of Japanese Patent Application No. 2011-156837 filed on Jul. 15, 2011 including the specification, drawings, and abstract is incorporated herein by reference in its entirety.

BACKGROUND

The present invention relates to a solid-state image pickup device, and more particularly to a solid-state image pickup device having an analog/digital converter (hereinafter referred to as "ADC") incorporated thereinto.

In recent cameras, attention has been paid to CMOS image sensors each having a CMOS device mounted therein. The CMOS image sensors are further classified into analog image sensors and digital image sensors. Although both of those image sensors have drawbacks and advantages, the digital image sensors have been increasingly expected from the viewpoints of a processing data rate.

In the recent application of the cameras, not only moving pictures can be taken, but also various applications in combination with downstream image processing have been proposed. For example, there is a case in which a close-up photo of a moment when a ball is hit on a tennis racket, or a face of a child who is passing a finishing line while running around in a playground at a school sports festival is intended to be taken. In this case, it is possible to merely point a camera at that direction to enable the camera to automatically determine a photo opportunity, and automatically press a shutter. In this application, there is a need to immediately transfer a shot image to an image processing module, and to convert photo information (analog) into image processing information (digital).

From the above background, analog/digital converters (ADC) for cameras have been already actively researched and developed. The severest problem with the CMOS image sensor resides in that data throughput is very large because information on pixels is all converted into digital information.

For example, it is assumed that one ADC executes a general moving image processing rate (30 fps) with ten million pixels. In this case, information on one pixel (for example, 4096 gray levels) is subjected to A/D conversion for 3 ns. The converted information is transferred to an output buffer. However, it is really difficult to transfer the information in a transfer time of 3 ns.

Incidentally, the invention disclosed in Japanese Patent Unexamined Application Publication No. 2008-283457 aims at enabling an effect caused by a wiring delay on a transfer line to a data output unit to be reduced, thereby taking in data on the data output unit with high precision. A column scanning circuit has a plurality of selection signal generators that output selection signals to corresponding holding circuits in synchronism with supplied drive clocks, and clock supply lines that propagate master clocks, and supply the master clocks to the selection signal generators as drive clocks. A data output circuit has a first data synchronous circuit that takes in and outputs detection data in synchronism with a first take-in clock, and a second data synchronous circuit that takes in the output data of the first data synchronous circuit in synchronism with a second take-in clock.

Also the invention disclosed in Japanese Patent Unexamined Application Publication No. 2009-130827 aims at suppressing shading appears in an output image due to differences in the amount of delay among ramp signals on the respective columns. A pixel unit includes a plurality of pixels, and outputs pixel signals to column signal lines corresponding to the respective columns. A latch circuit latches a count value of a counter until a voltage level of each ramp signal reaches a voltage level of the pixel signal as a digital pixel signal having a given bit. A controller receives the pixel signal having the given bit, and conducts correction for reducing a variation of the pixel signals after A/D conversion on the respective columns on the basis of the differences in the amount of delay among the ramp signals input to respective comparators, which are caused by the wiring lengths of the ramp signal lines.

Also, the invention disclosed in Japanese Patent Unexamined Application Publication No. 2010-166449 aims at reducing an effect caused by the wiring delay on the transfer line to the data output unit in the CMOS image sensor of a column parallel AD system. A data transfer circuit has a plurality of data output units that detect and output data transferred through respective transfer lines with a drive capability corresponding to a control signal, and a data transmitter that transfers the data to a corresponding transfer line in response to a selection signal. Further, a data transfer circuit includes a selector that outputs the selection signal to a corresponding transmitter, and a controller that controls the drive capability of the data output unit, generates the control signal for adjusting a data transfer delay, and outputs the control signal to the data output unit. The controller generates the control signal for adjusting the capability of drive according to a data transfer distance in the transfer line on the basis of the data output unit.

SUMMARY

In a configuration where the ADC takes in a signal of a pixel on a selected row through a vertical read line, and sequentially subjects the signal to A/D conversion, there is a need to arrange column circuits each including the ADC above and below a pixel array.

For example, since the column circuits are arranged above and below the pixel array, a horizontal width of the column circuit can be made double as long as pixel pitches. In this case, for example, if a pixel size is 5 μm, there is a need to limit a circuit such as the ADC to 10 μm which is double the pixel size.

For that reason, in a high-speed image sensor, various ingenuities such as ingenuity in layout are exercised so that a plurality of ADCs are aligned in columns as illustrated in FIG. 2.

In this example, in the ADC of 12 bits, AD conversion is completed with processing of 4096 times (12th power of 2 times). One step (hereinafter referred to as "1 LSB (least significant bit) of this conversion has a slight amplitude voltage of 250 μV, errors attributable to a layout shape or individual variations of several thousand columns are actualized (inter-column precision error).

For example, if a variation of 5 mV occurs in offset of the ADC on a specific column, an error of 25 LSB occurs in image information. Because of this error, an image output largely displaced from an original brightness is generated on only the specific column.

Also, it is difficult to eliminate all of the errors in the characteristics of a large number of circuits thus aligned. However, in order to reduce the error even if only slightly, various correcting methods have been proposed (Japanese Patent Unexamined Application Publication Nos. 2008-283457, 2009-130827, and 2010-166449.

In particular, there arises such a problem that the error of 1 LSB or lower between the adjacent columns cannot be reduced by the techniques disclosed in Japanese Patent Unexamined Application Publication Nos. 2008-283457, 2009-130827, and 2010-166449.

The present invention has been made to address the above problem, and therefore one object of the present invention is to cope with buffers arranged on counter signal lines and pitches of pixels narrowed by the layout of the counter signal lines. Further, another object of the present invention is to provide a solid-state image pickup device that reduces an error between the adjacent columns.

In summary, according to one aspect of the present invention, there is provided a solid-state image pickup device including: a plurality of pixels; a voltage generator that generates a reference voltage; a plurality of comparators that are aligned in one direction, and compare respective voltages output from the pixels with the reference voltage; a counter that counts in tandem with a change in the reference voltage generated by the voltage generator; a plurality of buffer circuits that are connected in series with the counter, and each sequentially receives an output of the counter; a plurality of latch circuits that take in a value input to an input terminal thereof according to respective trigger signals output from the comparators; a common signal line that is commonly connected to respective inputs of the latch circuits; and a plurality of signal lines that are connected to respective outputs of the buffer circuits, and allow the output of the counter to propagate therethrough. Each of the signal lines includes a first signal line path that is arranged to extend along one direction, and propagates the output of the counter, and a second signal line path that is branched from the first signal line path for supplying the output of the counter to the common signal line.

According to the aspect of the present invention, in the image sensor having the column ADC therein, the counter signals and the inversion signal wirings input to the adjacent latch circuits before and after the counter signal global buffer are electrically connected to each other, so as to reduce the delay time difference between the adjacent columns.

DETAILED DESCRIPTION

Figure 1:
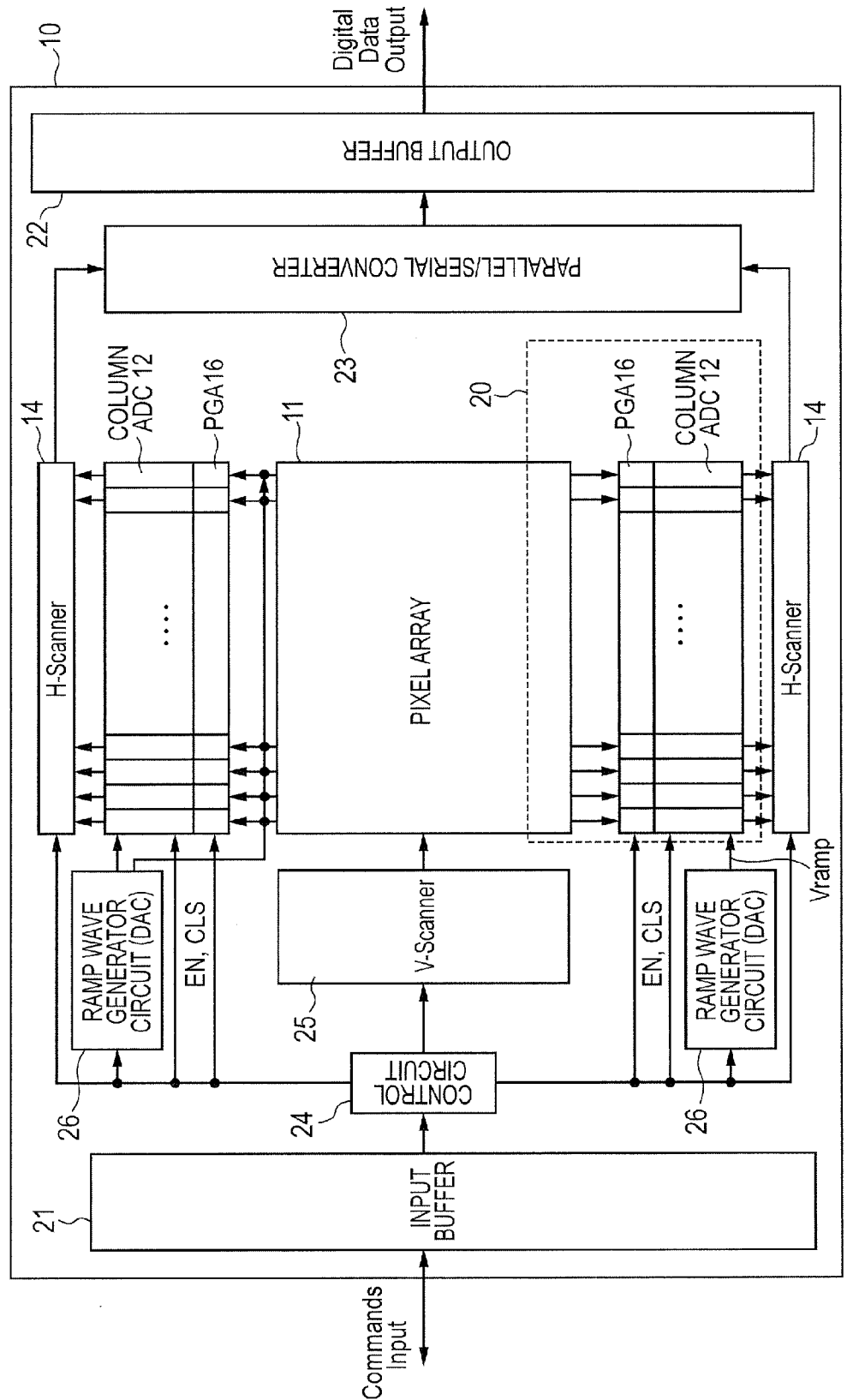
FIG. 1 is a block diagram illustrating an overall configuration of a solid-state image pickup device.

Hereinafter, the present invention will be described in detail with reference to the accompanying drawings. In the drawings, identical or corresponding parts are denoted by the same reference numerals or symbols, and their description will not be repeated.

(Overall Configuration Common to Solid-State Image Pickup Devices of Respective Embodiments)

FIG. 1 is a block diagram illustrating an overall configuration of a solid-state image pickup device. Referring to FIG. 1, a solid-state image pickup device 10 includes an input buffer 21, a control circuit 24, a vertical scanner (V-scanner) 25, a pixel array 11, ramp wave generator circuits 26, PGAs (programmable gain amplifiers) 16, column ADCs 12, horizontal scanners (H-scanners) 14, a parallel/serial converter 23, and an output buffer 22. It is preferable that the ramp wave generator circuits 26 are each configured by a DAC (digital analog converter).

The PGA 16 and the column ADC 12 are provided for each column of the pixel array 11. The PGA 16 and column ADC 12 corresponding to even columns (0, 2, 4, . . . ) of the pixel array 11 are arranged on an upper side of the pixel array, and the PGA 16 and column ADC 12 corresponding to add columns (1, 3, 5, . . . ) of the pixel array 11 are arranged on a lower side of the pixel array.

One horizontal scanner 14 and one ramp wave generator circuit 26 are disposed for each of the even columns and the odd columns of the pixel array.

The input buffer 21 receives a command and input data from the external. The control circuit 24 controls the operation of the overall CMOS image sensor. The vertical scanner 25 selects any one of the columns within the pixel array 11.

The pixel array 11 functions as an image pickup unit in which a plurality of pixels each having a photoelectric conversion element that converts a light signal into an electric signal are arranged in a matrix. The pixel array 11 outputs signals of the respective pixels on the selected row through a plurality of vertical read lines wired for the respective columns while the respective pixels are sequentially scanned for each row by the vertical scanner 25.

Each of the PGAs 16 amplifies the signal of each pixel output through each vertical read line, and output the amplified signal to a sample and hold circuit 18 which will be described with reference to FIG. 3.

Each of the column ADCs 12 holds the signal of each pixel sampled by the PGA 16, and converts the held signal of the pixel from an analog signal into a digital signal.

Each of the horizontal scanners 14 transfers the digital signals output from the column ADCs 12 corresponding to the respective columns of the pixel array 11 in parallel in a horizontal direction. The parallel/serial converter 23 converts parallel data transferred by the horizontal scanners 14 into serial data, and outputs the serial data to the output buffer 22. The output buffer 22 outputs output data to the external. Each of the ramp wave generator circuits 26 generates a ramp voltage Vramp that is varied in a stepwise manner in synchronism with clocks.

Figure 2:
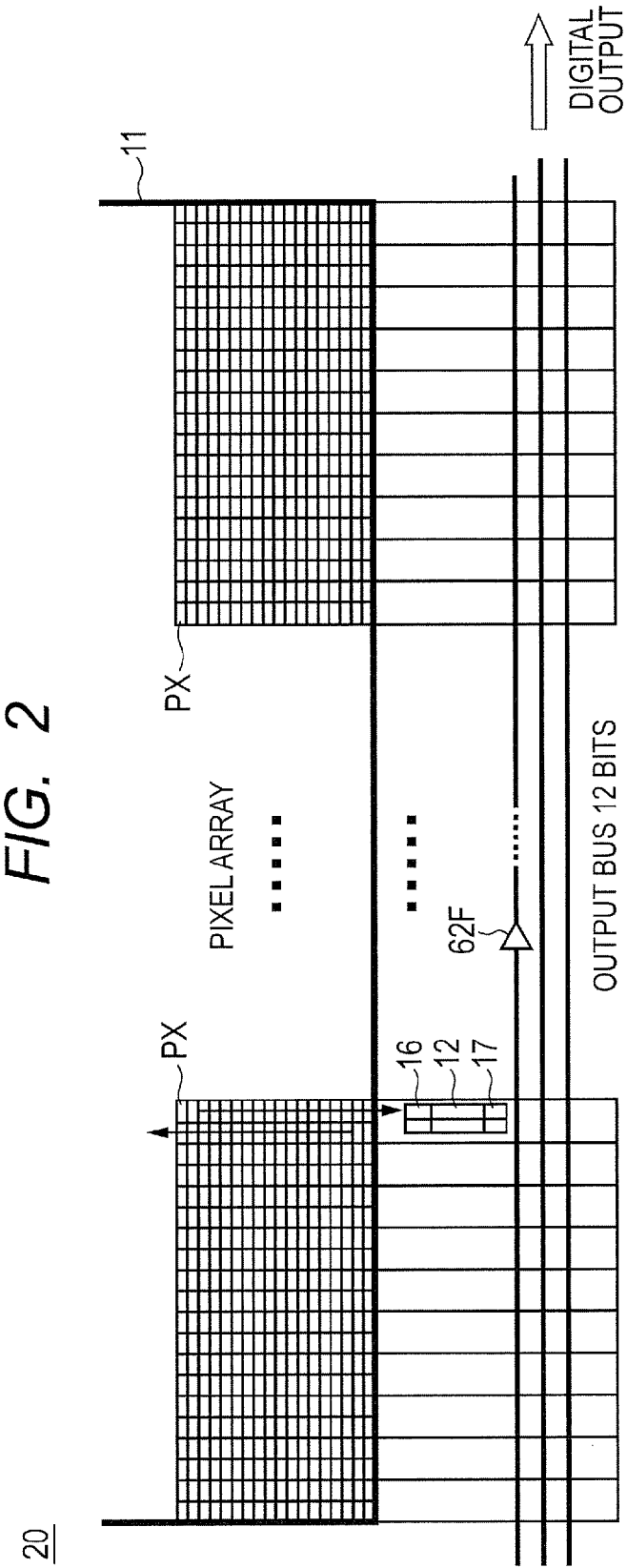
FIG. 2 is an enlarged view illustrating a portion of a pixel array and a column ADC in the solid-state image pickup device illustrated in FIG. 1.

FIG. 2 is an enlarged view illustrating a portion of a pixel array 11 and a column ADC 12 in the solid-state image pickup device 10 illustrated in FIG. 1.

Referring to FIG. 2, one column circuit is disposed for two columns of the pixels PX in the pixel array 11. Each of the column circuits includes the column ADC 12, the PGA 16, and a data latch/transfer circuit 17.

The PGA 16 amplifies pixel outputs sequentially transmitted from the pixels PX in the column direction, and outputs the amplified pixel outputs to the column ADC 12.

The column ADC 12 converts an analog signal received from the PGA 16 into a digital signal, and outputs the digital signal to the data latch/transfer circuit 17.

The data latch/transfer circuit 17 sequentially shifts digital values of the pixel outputs in the column direction, and outputs the digital signals for 3000 pixels to the external. The same circuit is also arranged on an upper side of the pixel array 11.

A plurality of global buffers GB62F are arranged on the signal lines of the digital signals in order to shape waveforms of the digital signals. The global buffers GB62F may be each configured by an inverter or a repeater (two inverters connected in series).

Figure 3:
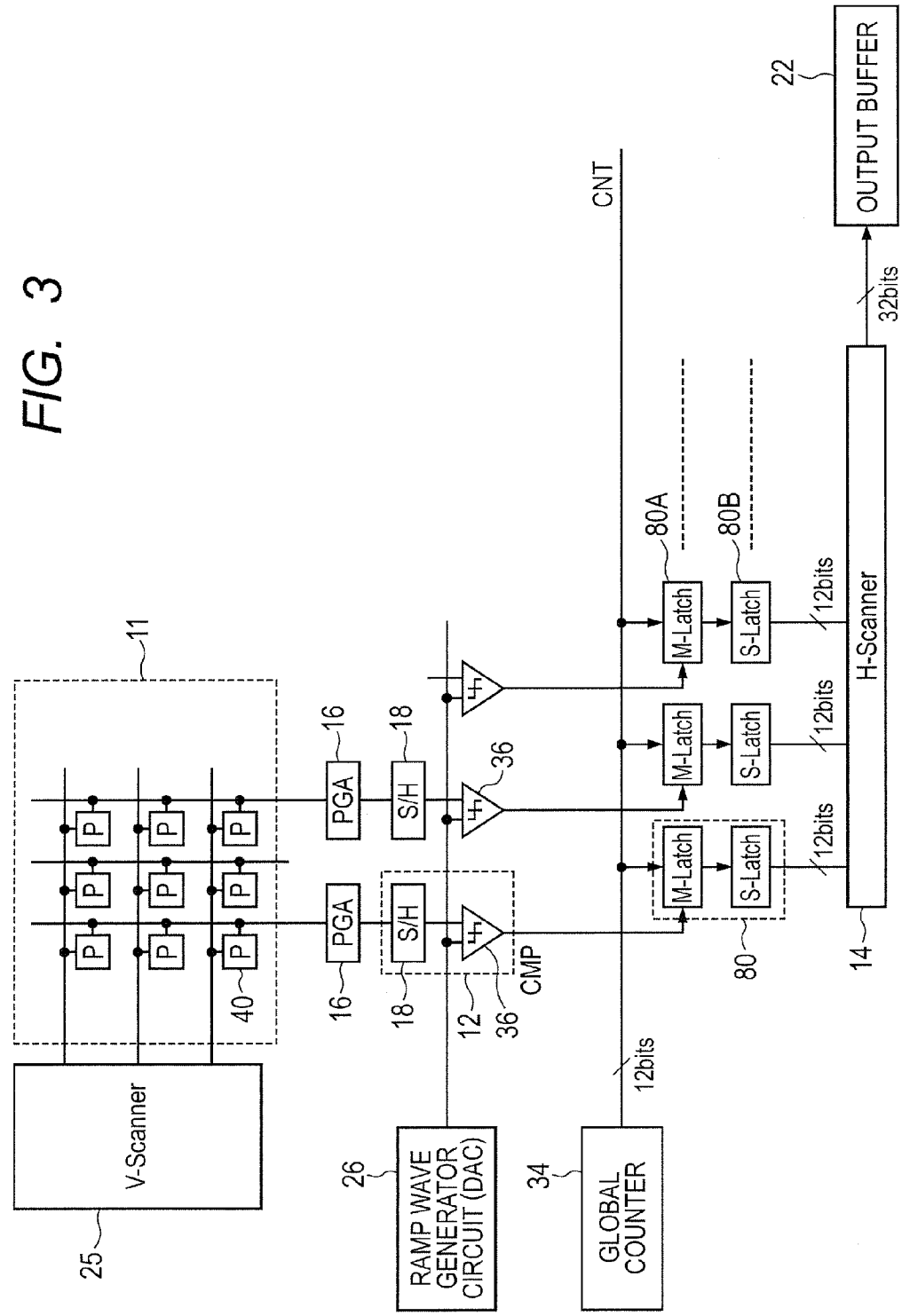
FIG. 3 is a block diagram illustrating the operation of subjecting each pixel signal to analog/digital conversion.

FIG. 3 is a block diagram illustrating the operation of subjecting each pixel signal to analog/digital conversion. Referring to FIG. 3, the pixel outputs of the pixels PX within the pixel array 11 which are selected in line by the vertical scanner 25 are transmitted to the PGAs 16. Each of the PGAs 16 amplifies the pixel outputs sequentially transmitted from the pixels PX in the column direction, and outputs the amplified pixel outputs to the sample and hold circuit 18. The sample and hold circuit 18 samples and holds the image outputs.

When no sample and hold circuit 18 is provided, a temporal change of the image outputs is faster than a time required for A/D conversion, a detection error is increased. With the provision of the sample and hold circuit 18, the signals sampled at the same timing can be subjected to the A/D conversion.

Comparators 36 are aligned along one direction, and each receive the output signal from the corresponding sample and hold circuit 18 and the ramp voltage Vramp that is changed by the ramp wave generator circuits 26 in the stepwise manner in synchronism with the clocks.

After comparing the output signal from the sample and hold circuit 18 with the ramp voltage Vramp as a reference voltage, the comparator 36 outputs, to a corresponding latch circuit 80, a trigger signal CMP for holding a counter signal output from a global counter 34.

Information on a counter signal CNT which is an output signal from the global counter 34 that counts up in tandem with the ramp wave generator circuits 26 is latched by the latch circuit 80. A signal line path of the counter signal CNT is configured by a wiring layer so as to extend along one given direction and allows the counter signal CNT to be propagated therethrough. The one direction indicates a direction along which the comparators 36 are aligned, a direction along which the column ADCs 12 are aligned, that is, a direction along which the sample and hold circuits 18 are aligned, and a direction along which the latch circuits 80 are aligned. Also, each of the latch circuits 80 includes a master latch circuit 80A (M-latch 80A), and a slave latch circuit 80B (S-latch 80B).

Each of the horizontal scanners 14 transfer the digital signals output from the latch circuits 80 in parallel in the horizontal direction. The parallel/serial converter 23 converts the parallel data transferred by the horizontal scanners 14 into the serial data, and output the serial data to the output buffer 22.

Figure 4:
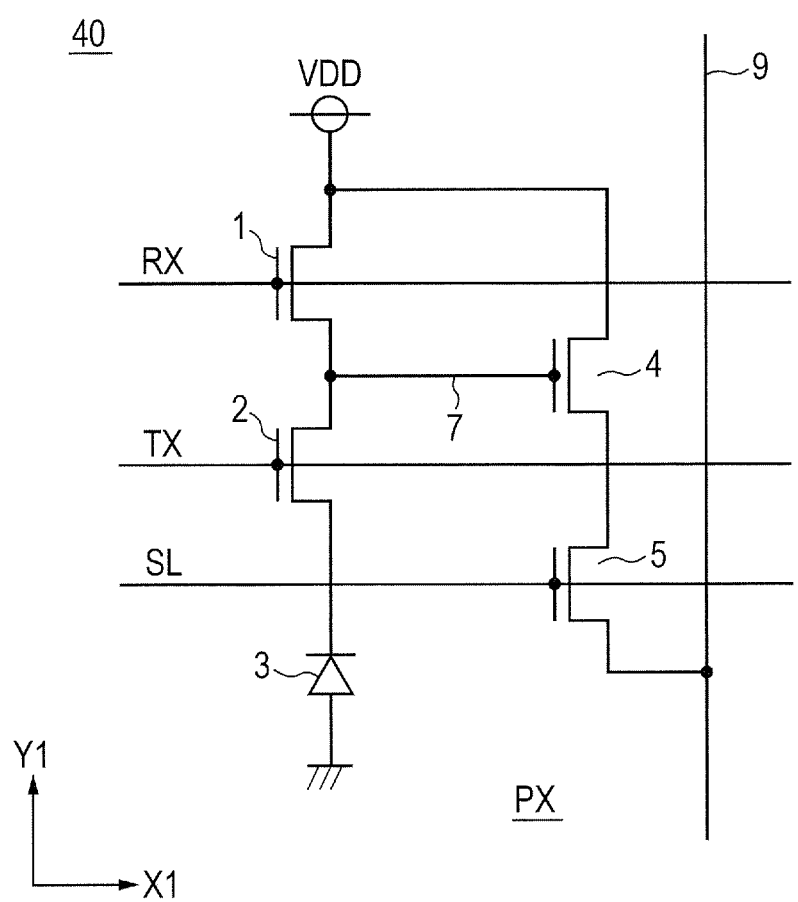
FIG. 4 is a diagram illustrating an electrical equivalent circuit of the pixels illustrated in FIG. 3.

FIG. 4 is a diagram illustrating an electrical equivalent circuit of the pixels PX illustrated in FIG. 3. Each of the pixels PX includes a photodiode 3 that converts the light signal into the electric signal, a transfer transistor 2 that transmits the electric signal generated by the photodiode 3 according to a transfer control signal TX on the transfer control line, and a reset transistor 1 that resets a floating diffusion 7 to a given voltage level according to a reset control signal RX on a reset control line.

The pixel PX also includes a source follower transistor 4 that transmits a supply voltage VDD on a power supply node to a source follower mode according to a signal potential on the floating diffusion 7, and a row selection transistor 5 that transmits the signal transmitted by the source follower transistor 4 to a vertical read line 9 according to a row selection signal SL on a row selection control line. The reset transistor 1, the transfer transistor 2, the source follower transistor 4, and the row selection transistor 5 are each configured an n-channel MOS transistor as an example.

Figure 5A:
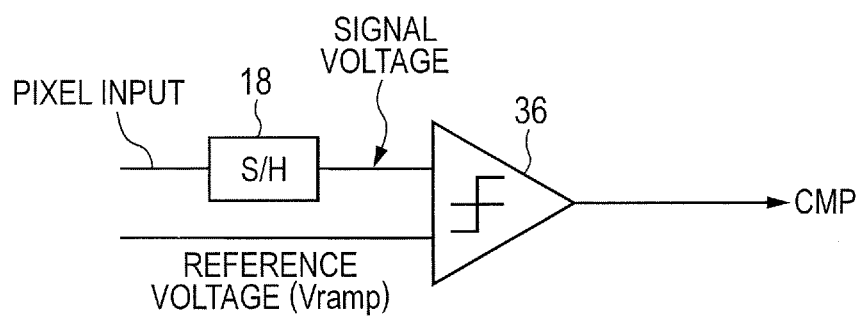
FIGS. 5A and 5B are diagrams illustrating a configuration example and operation of an integral ADC configuring an ADC illustrated in FIG. 3, respectively.
Figure 5B:
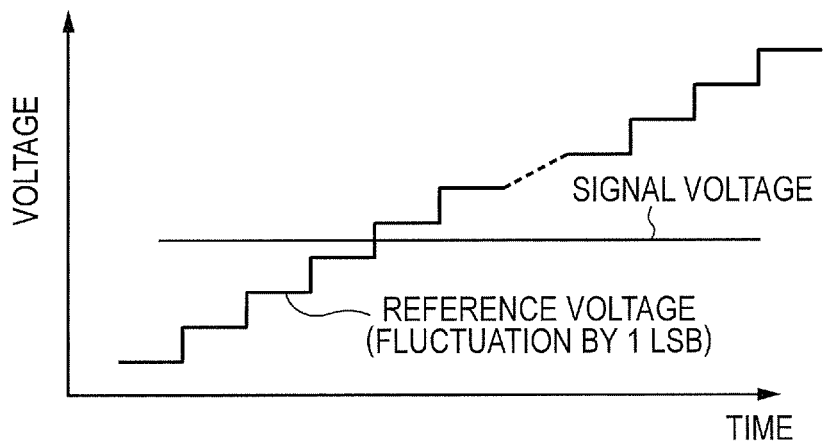

FIGS. 5A and 5B are diagrams illustrating a configuration example and operation of an integral ADC configuring an ADC illustrated in FIG. 3, respectively. As illustrated in FIG. 5A, the integral ADC is configured by the comparator 36, receives the pixel output as a signal voltage of the sample and hold circuit 18, and compares the signal voltage with the ramp voltage Vramp that is changed in the stepwise manner by each of the ramp wave generator circuits 26 as the reference voltage to conduct AD conversion.

The integral ADC starts count-up of the counter after having cleared a value of the counter at the time of initialization. As illustrated in FIG. 5B, the reference voltage is changed from a minimum voltage or a maximum voltage 1 LSB by 1 LSB to rise or fall in the stepwise manner.

The comparator 36 compares the signal voltage with the reference voltage, and represents the value of the counter when the comparison result is reversed as a digital value.

Because the integral ADC takes the above comparing method, if N is ADC resolution, a time proportional to 2N (Nth power of 2) is required for AD conversion.

In the above description, each of the column ADCs 12 is configured by the integral ADC, but may be configured by an ADC of a sub-range system instead.

Figure 6:
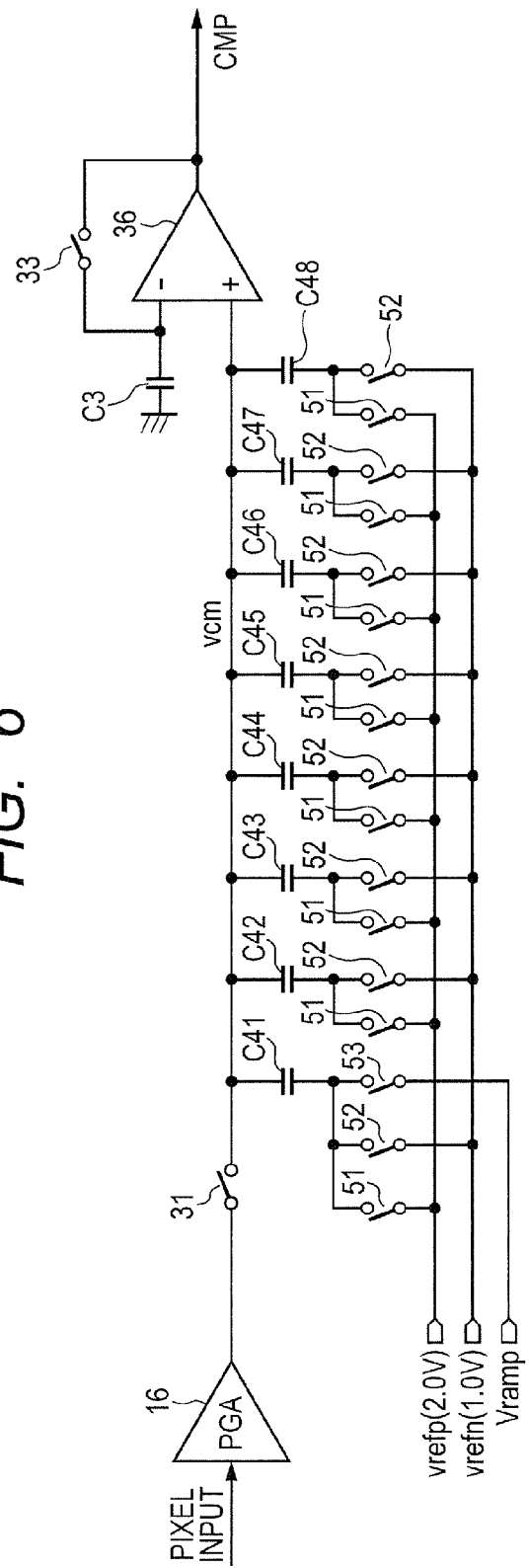
FIG. 6 is a circuit diagram schematically illustrating an example of a configuration of a sub-range ADC.

FIG. 6 is a circuit diagram schematically illustrating an example of a configuration of the sub-range ADC. FIG. 6 exemplifies the sub-range ADC of a charge comparator system. In the sub-range ADC, an AD conversion stage is classified into two stages of coarse and fine. The AD conversion system is not limited to the system illustrated in FIG. 6 as long as the AD conversion system has a conversion speed that enables real-time processing and also can be formed into a slender rectangular area illustrated in FIG. 2.

Referring to FIG. 6, the sub-range ADC includes a switch 31, a switch 33, a comparator 36, a capacitor C3, capacitors C41 to C48, and switches 51 to 53.

A positive input of the comparator 36 receives the optical signal and a dark signal which are output from each of the PGAs 16 through the switch 31. A negative input of the comparator 36 is connected with an output of the comparator 36 through the switch 33, and also connected with a capacitor C3 for holding the dark signal. The comparator 36 has, as operation modes, a comparison mode for comparing the signals supplied to the positive input and the negative input with each other, and a differential amplification mode that differentially amplifies the signals supplied to the positive input and the negative input.

The capacitors C41 to C48 have electric capacitances equal to each other, and have one ends capacitively coupled with a node vcm. The switches 51 and 52 connected to the other ends of those capacitors are sequentially switched to sequentially change potentials of the other ends of the capacitors C41 to C48 from vrefp (for example, 2.0 V) to vrefn (for example, 1.0 V), thereby determining which of eight ranges the potential of the node vcm belongs to.

In an initial stage, the switch 51 connected to each of the capacitors C41 to C48 is on, and the switches 52 and 53 are off. First, the switches 31 and 33 become on, and the comparator 36 is set to the differential amplification mode. In this state, when the dark signal is input to the PGA 16, the dark signal is held in the capacitor C3.

Subsequently, the switch 33 becomes off, and the comparator 36 is set to the comparison mode. Thereafter, the switch 31 becomes on, and the light signal is input to the PGA 16 whereby the amplified light signal is held in the node vcm. Thereafter, when the switch 31 turns off, the sample and hold operation is completed.

The switch 51 connected to the capacitor C41 changes from the on state to the off state, and the switch 52 changes from the off state to the on state. As a result, since the potential of the other end of the capacitor C41 capacitively coupled with the node vcm changes from vrefp to vrefn, the potential of the node vcm drops by (vrefp-vrefn)/8. Subsequently, likewise, the switches 51 and 52 sequentially switch on and off in the order from the capacitor C42 to the capacitor C48.

As a result, the potential of the node vcm drops by (vrefp-vrefn)/8. Once the trigger signal CMP that is the output signal of the comparator 36 changes from a high level to a low level, the on and off switching operation of the switches 51 and 52 is completed.

In this example, a 3-bit counter not shown is disposed within the control circuit 24 of FIG. 1, and an output value of the 3-bit counter changes in synchronism with the switching operation of the switches 51 and 52. Specifically, the 3-bit counter monitors the trigger signal CMP of the comparator 36, and holds an output value of the 3-bit counter when the value of the trigger signal CMP changes from the high level to the low level. As a result, upper 3 bits of the pixel signal is determined to complete a coarse conversion stage.

In a subsequent fine conversion stage, the open and close states of the switches 51 and 52 connected to the capacitors C41 to C48 are maintained in the state where the trigger signal CMP of the comparator 36 changes from the high level to the low level as they are. In this state, the switch 53 connected to the capacitor C41 changes from off to on, and the ramp voltage Vramp to be applied to the capacitor C41 through the switch 53 rises to vrefp+(vrefp-vrefn)×(256/2048).

At the same time, a 12-bit counter disposed within the control circuit 24 starts count-up from "0" in decimal conversion. Subsequently, the ramp voltage Vramp drops down to vrefn-(vrefp-vrefn)×(256/2048) in a slope manner. Once the ramp voltage Vramp has completely dropped, a value of the 12-bit counter becomes "2559" in the decimal conversion.

A 3-bit counter (not shown) of the control circuit 24 monitors the trigger signal CMP of the comparator 36, and holds an output value of the 12-bit counter when a value of the trigger signal CMP changes from the high level to the low level. Although a substantial conversion precision of the fine conversion stage is 11 bits, digital data of 12 bits is actually obtained with overrunning above and below a set voltage range by (vrefp-vrefn)×(256/2048). With the above operation, lower 12 bits of the pixel signal including the output value out of the range are determined to complete the fine conversion stage.

(Study Example)

Figure 7:
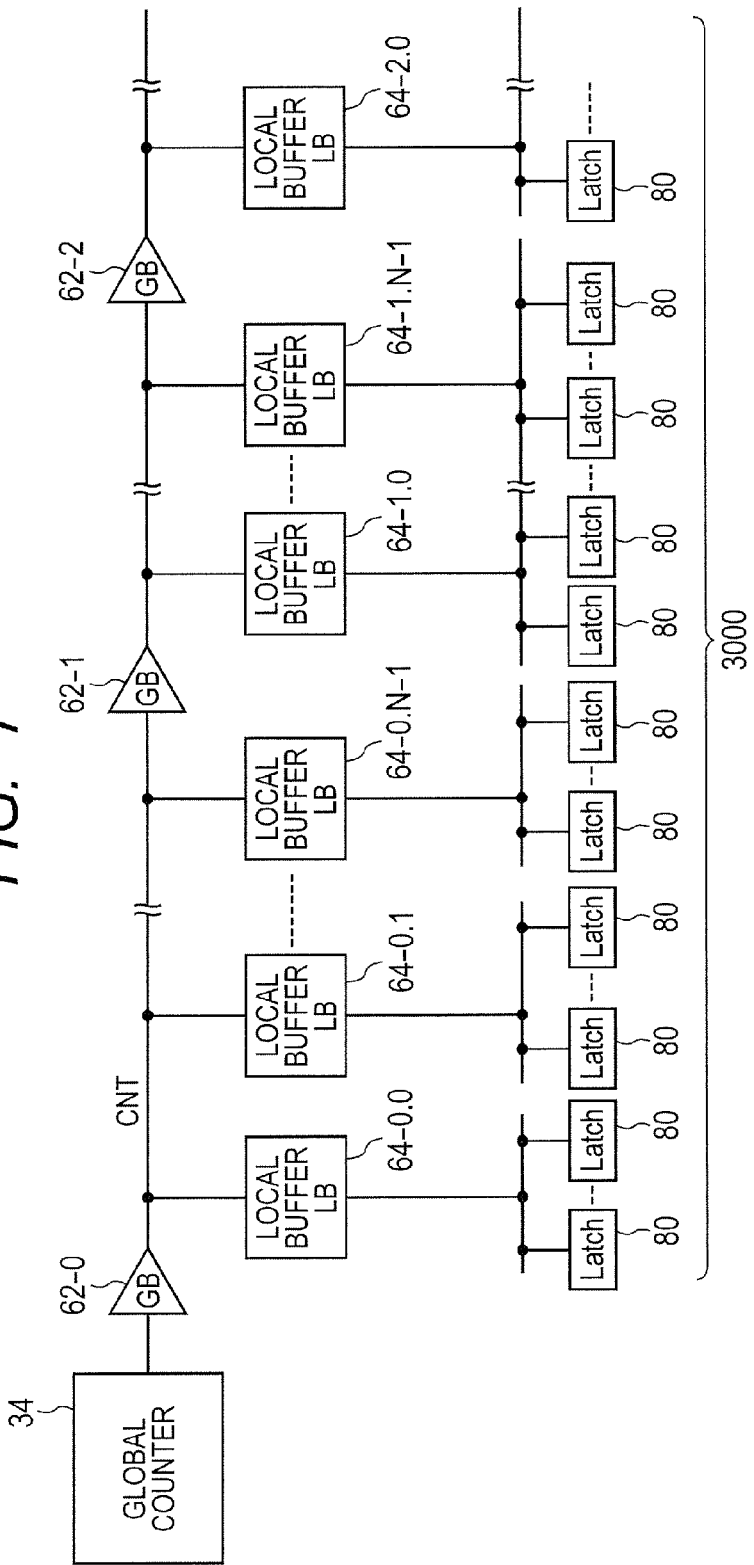
FIG. 7 is a diagram illustrating a signal line path until an output (1 bit) of a counter from a global counter is propagated to latch circuits in a study example.

FIG. 7 is a diagram illustrating a signal line path until an output (1 bit) of the counter from the global counter 34 is propagated to the latch circuits 80 in a study example. Referring to FIG. 7, the signal line path of the counter signal CNT, which is an output signal from the global counter 34, is configured by a wiring layer so as to extend along one given direction, and allows the counter signal CNT to be propagated therethrough. The one direction indicates a direction along which the comparators 36 (not shown) are aligned, a direction along which the column ADCs 12 (not shown) are aligned, that is, a direction along which the sample and hold circuits 18 (not shown) are aligned, and a direction along which the latch circuits 80 are aligned.

Global buffers GB62-0, GB62-1, . . . (hereinafter also collectively called "global buffer GB62") for shaping a waveform of the counter signal CNT are arranged on the signal line path.

Signal line paths of a local counter signal CNT_BUF and an inversion signal CNT_BUF_B thereof not shown for supplying the counter signal CNT to the latch circuits 80 are branched from the signal line path of the counter signal CNT.

Local buffers LB64—0.0, LB64—0.1, . . . , LB64—0.N-1, 64—1.0, . . . (hereinafter also collectively called "local buffer LB64") for driving the local counter signal CNT_BUF and the inversion signal CNT_BUF_B are arranged on the branched signal line paths.

In this example, about 3000 latch circuits 80 are connected for each counter signal of 1 bit. Also, one global buffer GB62 is arranged on the signal line path of the counter signal CNT every 192 columns. That is, 10 to 20 global buffers GB62 are arranged on one counter signal CNT.

Also, one local buffer LB64 is arranged on the signal line path branched from the signal line path of the counter signal CNT every 24 latch circuits 80. The local buffer LB64 is normally arranged immediately below or in the vicinity of the signal line path of the counter signal CNT.

Also, although not shown, a trigger signal CMT is supplied to the respective latch circuits 80. The counter signal CNT and the trigger signal CMT are configured by different wiring layers on a semiconductor chip.

Figure 8:
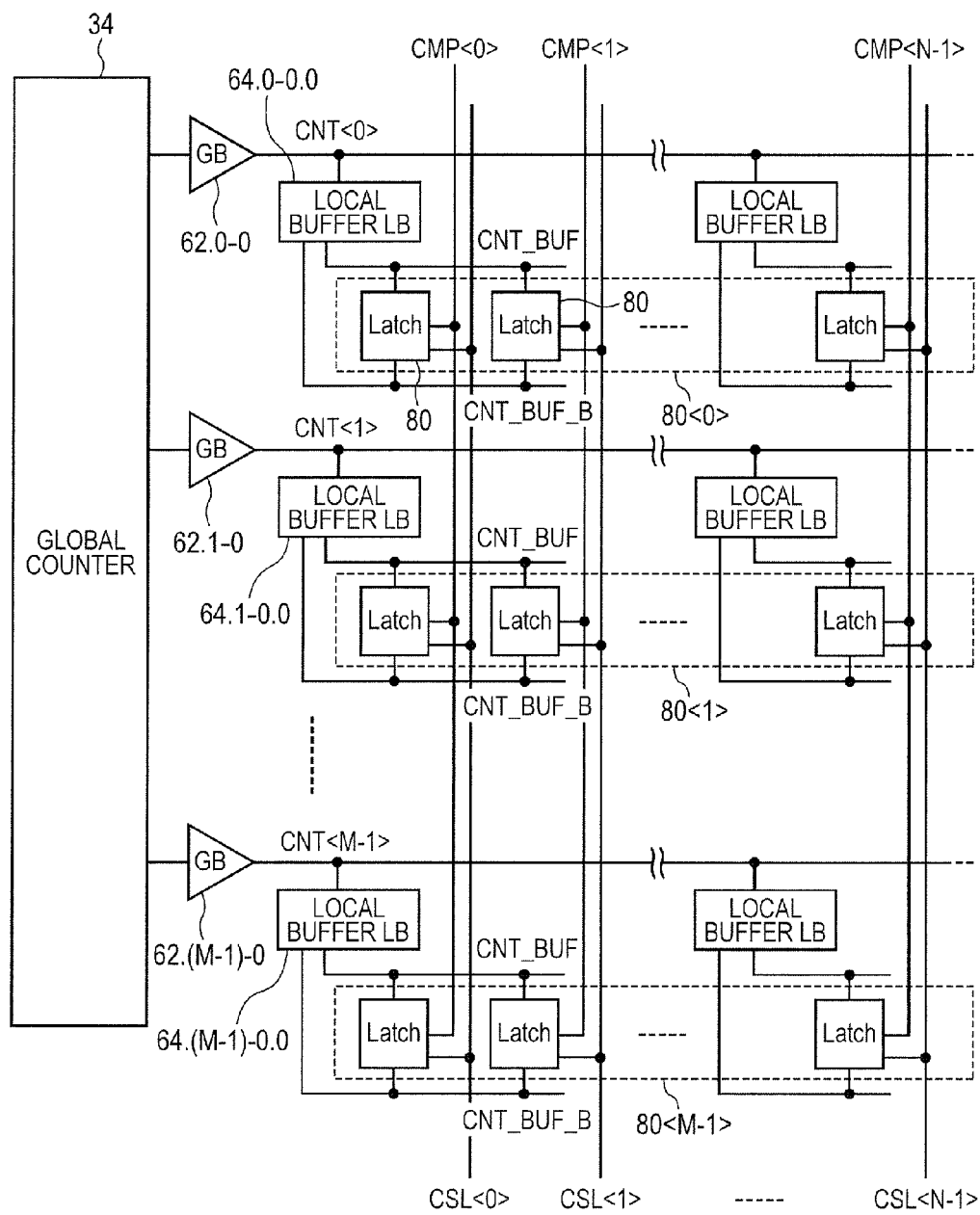
FIG. 8 is a diagram illustrating a signal line path until an output (M bits) of the counter from the global counter is propagated to the latch circuits in the study example.

FIG. 8 is a diagram illustrating a signal line path until an output (M bits) of the counter from the global counter 34 is propagated to the latch circuits 80 in the study example. The configuration of FIG. 8 which will be described below is common in the respective embodiments except for a connection relationship of the local counter signal CNT_BUF (inversion signal CNT_BUF_B).

Referring to FIG. 8, M counter signals CNT from the global counter 34 and n trigger signals CMP output from the comparator 36 described with reference to FIG. 5 are wired. The signal lines of the counter signals CNT<0>, CNT<1>, . . . , CNT<M−1> (hereinafter also collectively called "counter signal CNT") are much longer than other signal lines.

Also, the signal line path of the counter signal CNT<i> is configured by a wiring layer so as to extend along one given direction, and allows the counter signal CNT to be propagated therethrough. The one direction indicates a direction along which the comparators 36 (not shown) are aligned, a direction along which the column ADCs 12 (not shown) are aligned, that is, a direction along which the sample and hold circuits 18 (not shown) are aligned, and a direction along which the latch circuits are aligned.

A global buffer GB62.i-j (i=0, 1, . . . , M−1, and j=0, . . . ) for shaping a waveform of the counter signal CNT<i> is arranged on the signal line path. That is, the global buffer GB62.i-j indicates a j-th global buffer arranged on the signal line path of the counter signal CON<i>. The global buffer GB62.i-j (i=0, 1, . . . , M−1, and j is an integer) corresponds to the local buffer LB64 of FIG. 7.

The signal line paths of the local counter signal CNT_BUF and the inversion signal CNT_BUF_B thereof not shown for supplying the counter signal CNT<i> to the latch circuits 80 are branched from the signal line path of the counter signal CNT<i>.

The local buffer LB64.i-j.k (i=0, 1, . . . , M−1 and j, k=0, . . . ) for driving the local counter signal CNT_BUF and the inversion signal CNT_BUF_B thereof is arranged on each of the branched signal line paths. That is, the local buffer LB64.i-j.k indicates a k-th local buffer driven by an output signal of a j-th global buffer which is arranged on the signal line path of the counter signal CNT<i>. The local buffer LB64.i-j.k (i=0, 1, . . . , M−1 and j, k=0, . . . ) corresponds to the local buffer LB64 in FIG. 7.

The signal line path of the counter signal CNT<i> is longer than other signal lines, and therefore in order to shape the waveform, the global buffer GB62.i-j (i=0, 1, . . . , M−1 and j=0, . . . ) is arranged on the signal line path of the counter signal CNT<i> every 192 columns.

Also, the local buffer LB64.i-j.k (i=0, 1, . . . , M−1 and j, k=0, . . . ) is arranged on the signal line branched from the signal line path of the counter signal CNT<i>, and generates the local counter signal CNT_BUF and an inversion signal CNT_BUF_B thereof. The local buffer LB64.i-j.k (i=0, 1, . . . , M−1 and j, k=0, . . . ) is normally immediately below or in the vicinity of the signal line path of the counter signal CNT<i>.

In the counter signals CNT<0> to CNT<M−1> (for example, since the counter of FIG. 3 is 12-bit output, M=12 is satisfied) which are outputs of the global counter 34, the counter signal CNT<0> corresponds to an LSB (least significant bit) of the output value of the counter, and the counter signal CNT<M−1> corresponds to an MSB (most significant bit) of the output value of the counter. However, without being limited to this configuration, the counter signal CNT<M−1> may be set as the LSB of the counter output value, and the counter signal CNT<0> may be set as the MSB of the counter output value.

The output values of the respective counters are propagated to the latch circuit group 80<0>, 80<1>, . . . , 80<M−1> by the local counter signal CNT_BUF and the inversion signal CNT_BUF_B thereof which are driven by the respective local buffers LB64.i-j.k (i=0, 1, . . . , M−1 and j, k=0, . . . ). In this example, the local counter signal CNT_BUF (inversion signal CNT_BUF_B) is disposed for each local buffer LB64.i-j.k, and the respective signal lines thereof are separated from each other.

Also, it is preferable that a plurality of latch circuit groups 80<0>, 80<1>, . . . , and 80<M−1> corresponding to the respective bits are arranged closer the comparator 36 (not shown) as the latch circuits 80 are closer to the LSB side. Specifically, it is preferable that the latch circuit groups are so aligned as to be closer to the comparator 36 in the order from the latch circuit group 80<M−1> to the latch circuit group 80<0>.

The output data of the local counter signal CNT_BUF and the inversion signal CNT_BUF_B thereof is latched by the latch circuit 80 in response to the trigger signal CMP, and data is transferred to the output buffer 22 under control of the signal CSL.

Figure 9:
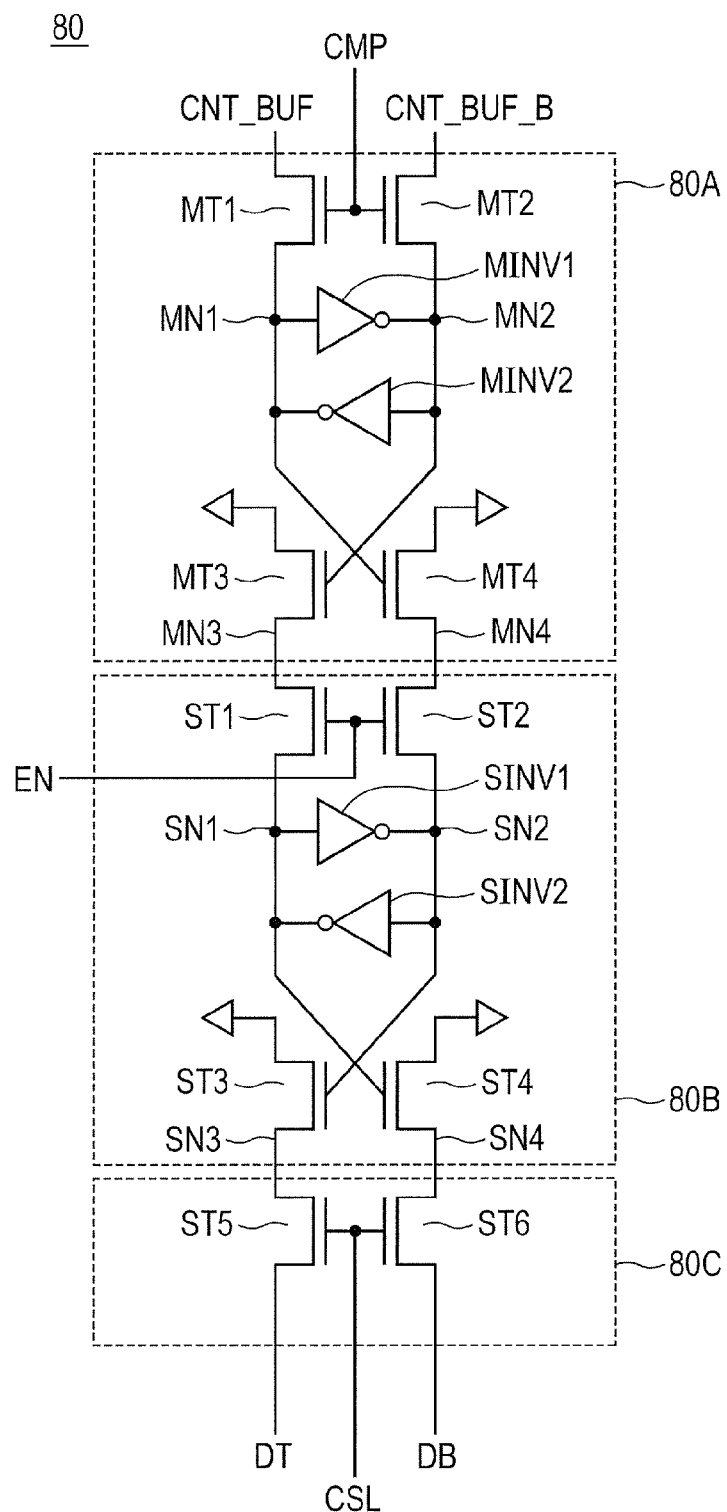
FIG. 9 is a circuit diagram illustrating the details of the latch circuit common to the study example and the respective embodiments.

FIG. 9 is a circuit diagram illustrating the details of the latch circuit 80 common to the study example and the respective embodiments. Referring to FIG. 9, the latch circuit 80 includes the master latch circuit 80A, the slave latch circuit 80B, and a latch output control circuit 80C.

The master latch circuit 80A includes an NMOS transistor MT1 having a gate receiving the trigger signal CMP, and a drain receiving the local counter signal CNT_BUF, an NMOS transistor MT2 having a gate receiving the trigger signal CMP, and a drain receiving the inversion signal CNT_BUF_B of the local counter signal CNT_BUF, and inverters MINV1 and MINV2 configuring a holding circuit that holds data of the local counter signal CNT_BUF and the inversion signal CNT_BUF_B of the local counter signal CNT_BUF.

The master latch circuit 80A further includes an NMOS transistor MT3 having a gate receiving an output signal of the MINV1 and a source electrode connected to a ground potential, and an NMOS transistor MT4 having a gate receiving an output signal of the MINV2 and a source electrode connected to the ground potential.

The local counter signal CNT_BUF and the inversion signal CNT_BUF_B thereof are controlled according to the trigger signal CMP. When the trigger signal CMP becomes H level, the NMOS transistor MT1 and the NMOS transistor MT2 turn on, and the output of the local counter signal CNT_BUF and the output of the inversion signal CNT_BUF_B are latched by the master latch circuit 80A.

The data latched by the master latch circuit 80A is transferred to the downstream slave latch circuit 80B according to an enable signal EN. The enable signal EN is activated after all of the counts have been completed by the global counter 34, and data is transferred to the slave latch circuit 80B. A circuit configuration of the slave latch circuit 80B is identical with that of the master latch circuit 80A, and therefore its description will not be repeated.

The latch output control circuit 80C includes an NMOS transistor ST5 and an NMOS transistor ST6 having gates receiving the CSL, and drains connected to respective nodes receiving outputs of the data and its inversion data latched by the slave latch circuit 80B.

The data and the inversion data latched by the slave latch circuit 80B are transferred to the horizontal scanners 14 through the signal DT and the signal DB by activation of the signal CSL, converted by the parallel/serial converter 23, and sequentially read to the external.

Figure 10:
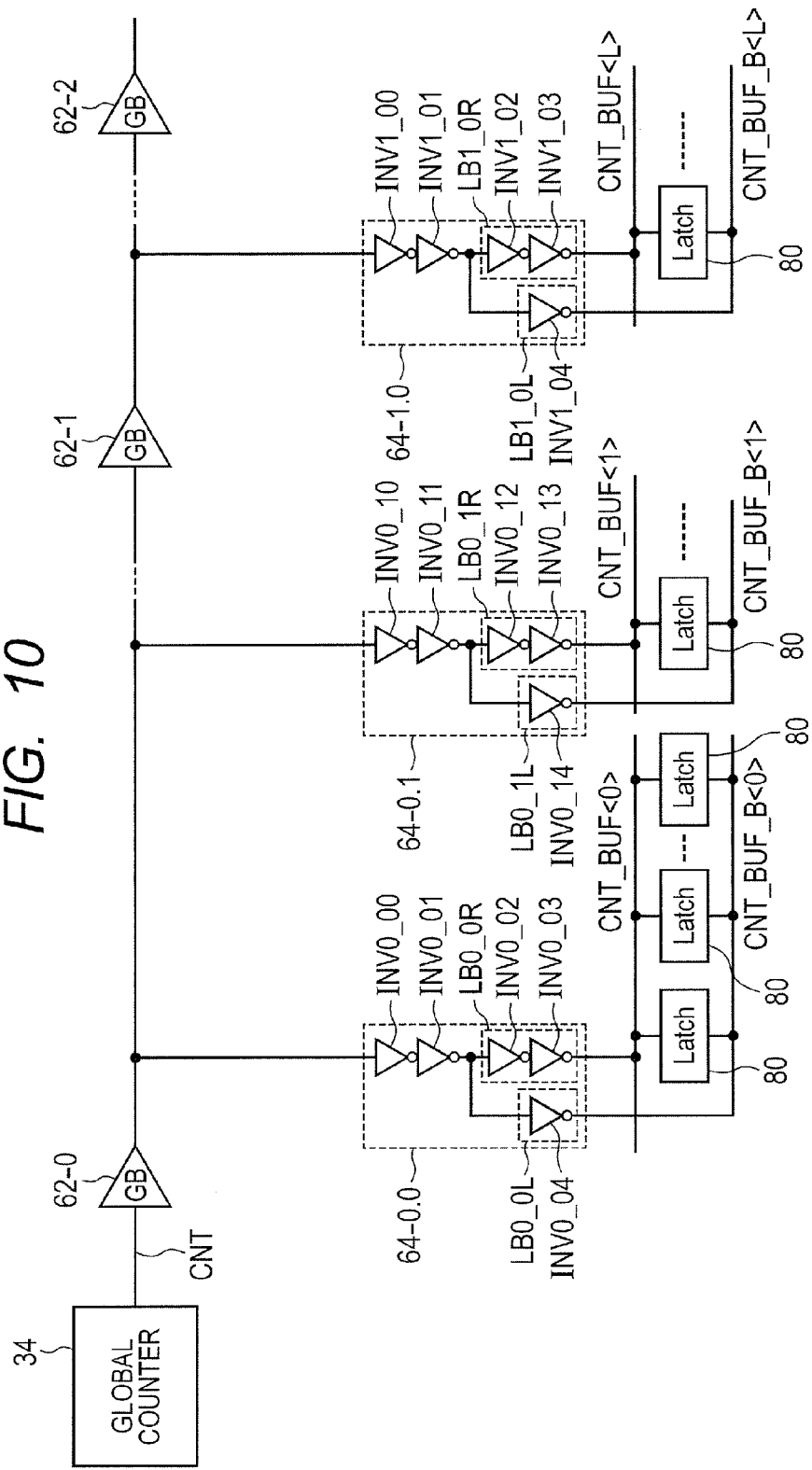
FIG. 10 is a diagram illustrating a signal line path until an output (1 bit) of the counter from the global counter is propagated to the latch circuits in the study example.

FIG. 10 is a diagram illustrating a signal line path until the output (1 bit) of the counter from the global counter 34 is propagated to the latch circuits 80 in the study example.

In addition to the description in FIGS. 7 and 8, in order to propagate the count value to the latch circuits 80, the signal line paths of the local counter signal CNT_BUF and the inversion signal CNT_BUF_B corresponding to each local buffer LB64 are branched from the signal line path of the counter signal CNT.

Specifically, a signal line path of a local counter signal CNT_BUF<0> to which the counter signal CNT corresponding to a local buffer LB64—0.0 is supplied is provided, and a signal line path of a local counter signal CNT_BUF<1> to which the counter signal CNT corresponding to a local buffer LB64—0.1 is supplied is provided.

Further, the local counter signal CNT_BUF<0> that supplies the count value is connected to the plurality of latch circuits 80. In other words, the local counter signal CNT_BUF<0> common to the plurality of latch circuits is supplied to those latch circuits 80. This is applied to not only the local counter signal CNT_BUF<0>, but also other local counter signals CNT_BUF<0>, and its description will not be repeated.

However, in the study example, the local counter signal CNT_BUF<i> and the local counter signal CNT_BUF<i+1> are separated from each other. For that reason, the count values to be supplied to the latch circuits 80 connected to those local counter signals CNT_BUF are different from each other.

That is, the same count value is output to the latch circuits 80 connected to the same local counter signal CNT_BUF<i>, but different count values are supplied to the latch circuits 80 connected to the different local counter signals.

More specifically, since the arbitrary local counter signal CNT_BUF<i> and the local counter signal CNT_BUF<i+1> are separated from each other, the common counter signal is not supplied to the latch circuits 80 connected to the respective local counter signal CNT_BUF<i> and local counter signal CNT_BUF<i+1>. Likewise, this relationship is applied to their inversion signals CNT_BUF_B.

The local buffer LB64—0.0 includes two-stage inverters INV0_00 and INV0_01 connected in series, a sub local buffer LB0_0R connected between an output node of the inverter INV0_01 and a node that supplies the local counter signal CNT_BUF, and a sub local buffer LB0_0L connected between the output node of the inverter INV0_01 and a node that supplies the inversion signal CNT_BUF_B of the counter signal.

The sub local buffer LB0_0R includes inverters INV0_02 and INV0_03 connected in series, and the sub local buffer LB_0L includes an inverter INV0_04.

The local counter signal CNT_BUF and the inversion signal CNT_BUF_B are generated by the sub local buffers LB0_0R and LB0_0L.

The configurations of the sub local buffers LB0_0R and LB0_0L have only to have a complementarity relation between the signals output therefrom, and other configurations may be applied.

Also, the other local buffers LB64—0.1, . . . , LB64—1.0, . . . , have the same configuration as that of the local buffer LB64—0.0, and therefore their description will not be repeated.

Figure 11:
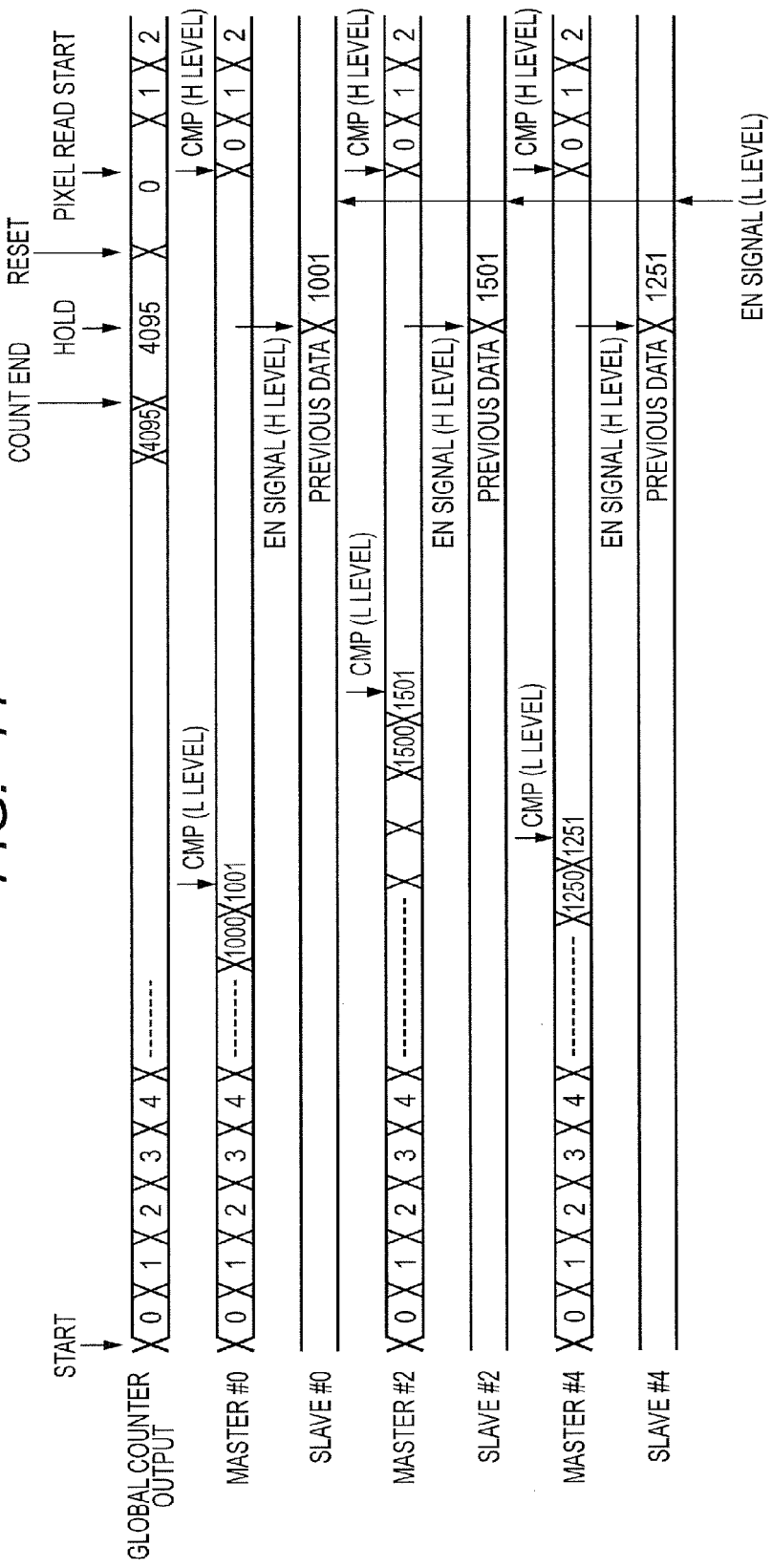
FIG. 11 is a diagram illustrating the operation of the latch circuit that latches the output (1 bit) from the global counter in the study example.

FIG. 11 is a diagram illustrating the operation of the latch circuit 80 that latches the output (1 bit) from the global counter 34 in the study example.

Referring to FIGS. 9 to 11, the global counter output represents the output of the counter signal CNT of the global counter 34 in tandem with the ramp wave generator circuits 26. For example, in the DAC of 12 bits, the count value of the global counter 34 has 4096 stages of <0> to <4095>. Masters #0, #2, and #4 represent the output of the master latch circuit 80A. Slaves #0, #2, and #4 represent the output of the slave latch circuit 80B.

The count value of the global counter 34 increments by one. In this situation, in the masters #0, #2, and #4, the count value (digital value) of the global counter 34 immediately before the trigger signal CMP is rendered inactive (L level) by the comparator 36 is latched by the master latch circuit 80A. The count values of the respective stages <1000>, <1500>, and <1250> are held in the master latch circuit 80A.

After the count of the global counter 34 has been completed, the count value of the stage <4095> is held by the control circuit 24.

After the count of the global counter 34 has been completed, an enable signal EN from the control circuit 24 is switched from inactive (L level) to active (H level) whereby the data held by the masters #0, #2, and #4 are transferred to the slaves #0, #2, and #4 at the same time. While the enable signal EN is being inactive (L level), the slaves #0, #2, and #4 continue to hold the previous data.

When all data of the master latch circuit has been transferred to the slave latch circuit 80B, the enable signal EN is switched from active (H level) to inactive (L level) by the control circuit 24. Thereafter, the trigger signal CMP is switched from inactive (L level) to active (H level), and a subsequent pixel starts to be read. The above operation is repetitively conducted for all of the bits.

The data transferred to the slave latch circuit 80B is switched from inactive (L level) to active (H level), to thereby be transferred to the output buffer 22.

Figure 12:
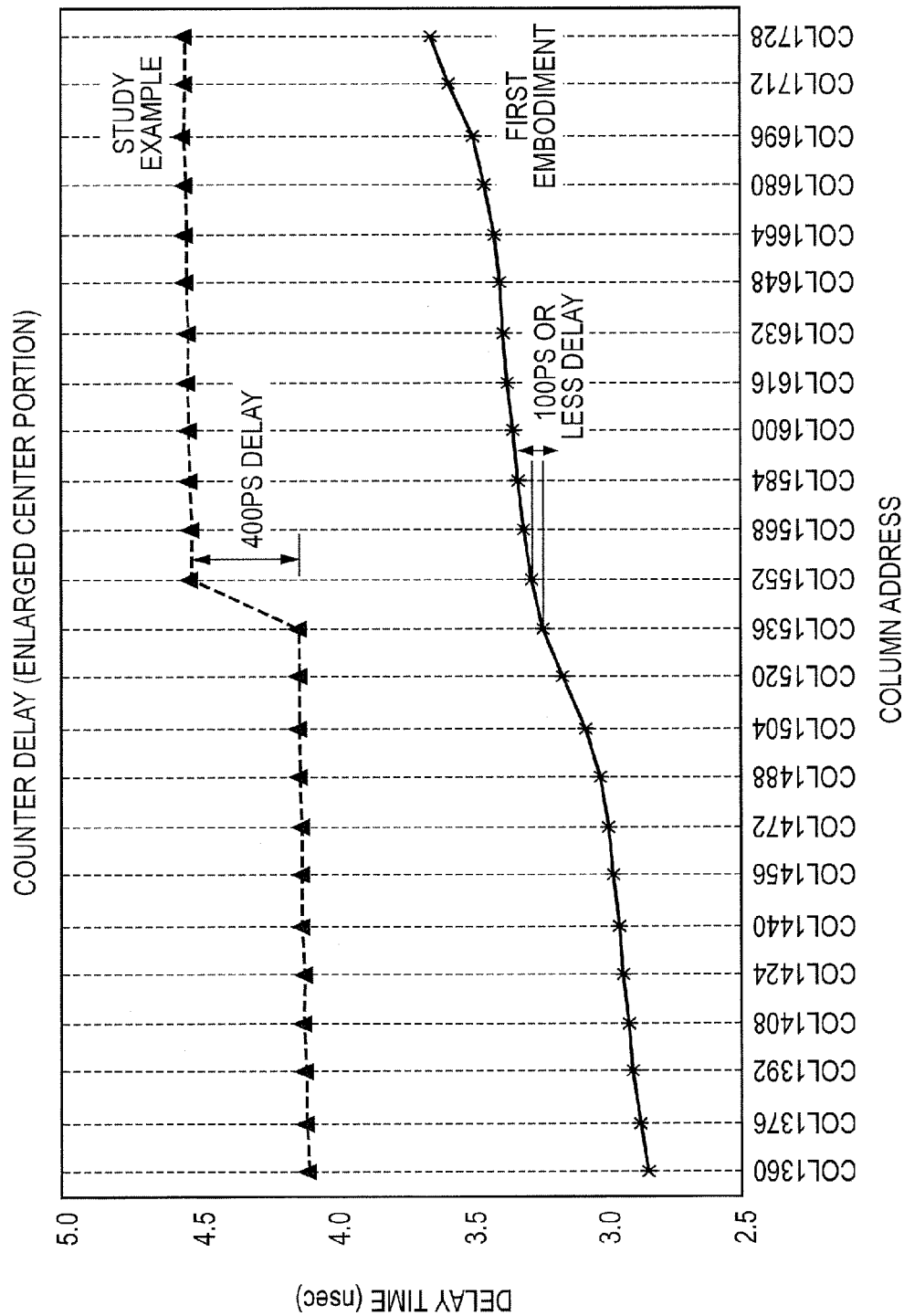
FIG. 12 is a diagram illustrating results of simulation for measuring a delay time of a counter signal to each column address.

FIG. 12 is a diagram illustrating results of simulation for measuring a delay time of a counter signal to each column address.

Referring to FIG. 12, a delay time (nsec) between the adjacent columns is represented by the axis of ordinate, and column address Nos. are represented by the axis of abscissa. A waveform indicated by a dotted line is a waveform of the simulation result in the configuration of the study example, and a waveform indicated by a solid line is a waveform of the simulation result in the configuration of a first embodiment that will be described later.

In the waveform (dotted line) representative of the study example, when a delay time among the columns before COL1356 is compared with a delay time among the columns after COL1552, a difference in the delay time of about 400 psec occurs between COL1356 and COL1552 (global buffer delay time difference). This is because the global buffer GB62 is arranged between COL1356 and COL1552, and the delay time difference is caused by the global buffer GB62.

Likewise, as described in FIG. 10, because the local counter signal CNT_BUF and the inversion signal CNT_BUF_B are separated from each other according to the local buffer LB64, a delay time occurs between the adjacent latch circuits even in the local buffer LB64 (local buffer delay time difference).

For example, the above delay time corresponds to the delay time difference between COL1520 and COL1536, or between COL1552 and COL1568. In the study example, a fluctuation difference in the local buffer delay time difference is much smaller than a fluctuation difference in the global buffer delay time difference.

The global buffer delay time difference is much larger than the local buffer delay time difference, and a large delay occurs in an arrival time of the counter signal before and after the global buffer GB62. Also, the respective fluctuation differences in the global buffer delay time difference and the local buffer delay time difference are terrific. As a result, an image output largely displaced from an original brightness is generated on only the specific column although falling within a range of 1 LSB.

Figure 13:
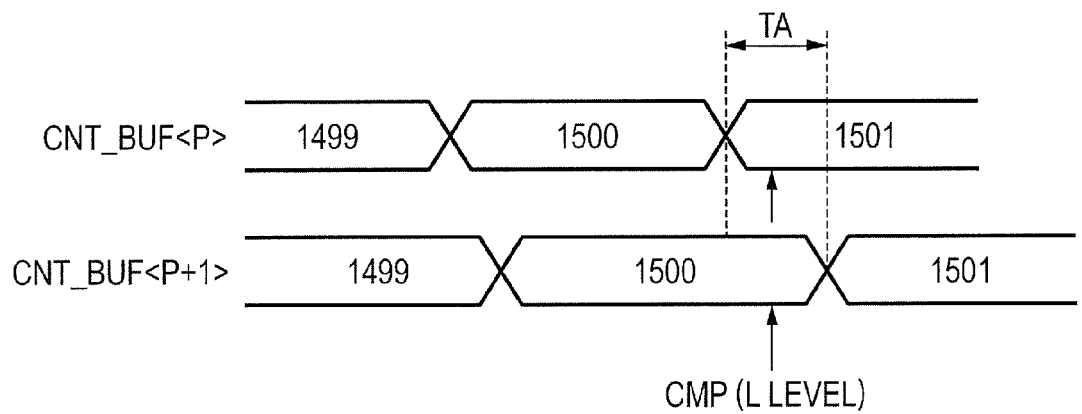
FIG. 13 is a diagram illustrating a delay of a counter value of each local counter signal CNT_BUF in the study example.

FIG. 13 is a diagram illustrating a delay of a counter value of each local counter signal CNT_BUF in the study example.

FIG. 13 illustrates a count value when two adjacent latch circuits are connected to respective different local counter signals CNT_BUF<P> and CNT_BUF<P+1>.

When the trigger signal CMP is switched from active to inactive, a count value <1051> is supplied to the latch circuit to which the count value is supplied from the local counter signal CNT_BUF<P>. On the other hand, a count value <1500> is supplied to an adjacent latch circuit to which the count value is supplied from the local counter signal CNT_BUF<P+1>.

In the configuration where the local counter signal CNT_BUF<P> and the local counter signal CNT_BUF<P+1> are separated from each other as in the study example, a delay (time TA) of the output of the count value occurs.

When the count value <1501> is desired, an image displaced from an original brightness is output to the latch circuit to which the count value is supplied from the local counter signal CNT_BUF<P+1>. Such a delay is further increased before and after the global buffer GB62.

As described above, in the configuration of the study example, the local counter signal CNT_BUF (inversion signal CNT_BUF_B) corresponding to each local buffer LB64 is provided, and not a common signal line but a separate signal line is provided between the local counter signals CNT_BUF (inversion signals CNT_BUF_B). Therefore, this configuration causes an increase in the delay time difference of the count signal CNT, or a variation in the delay time.

In order to solve the above problem, the respective embodiments will be described below. In the description of the respective embodiments, in the drawings, identical or corresponding parts are denoted by the same symbols, and their description will not be repeated.

First Embodiment

Figure 14:
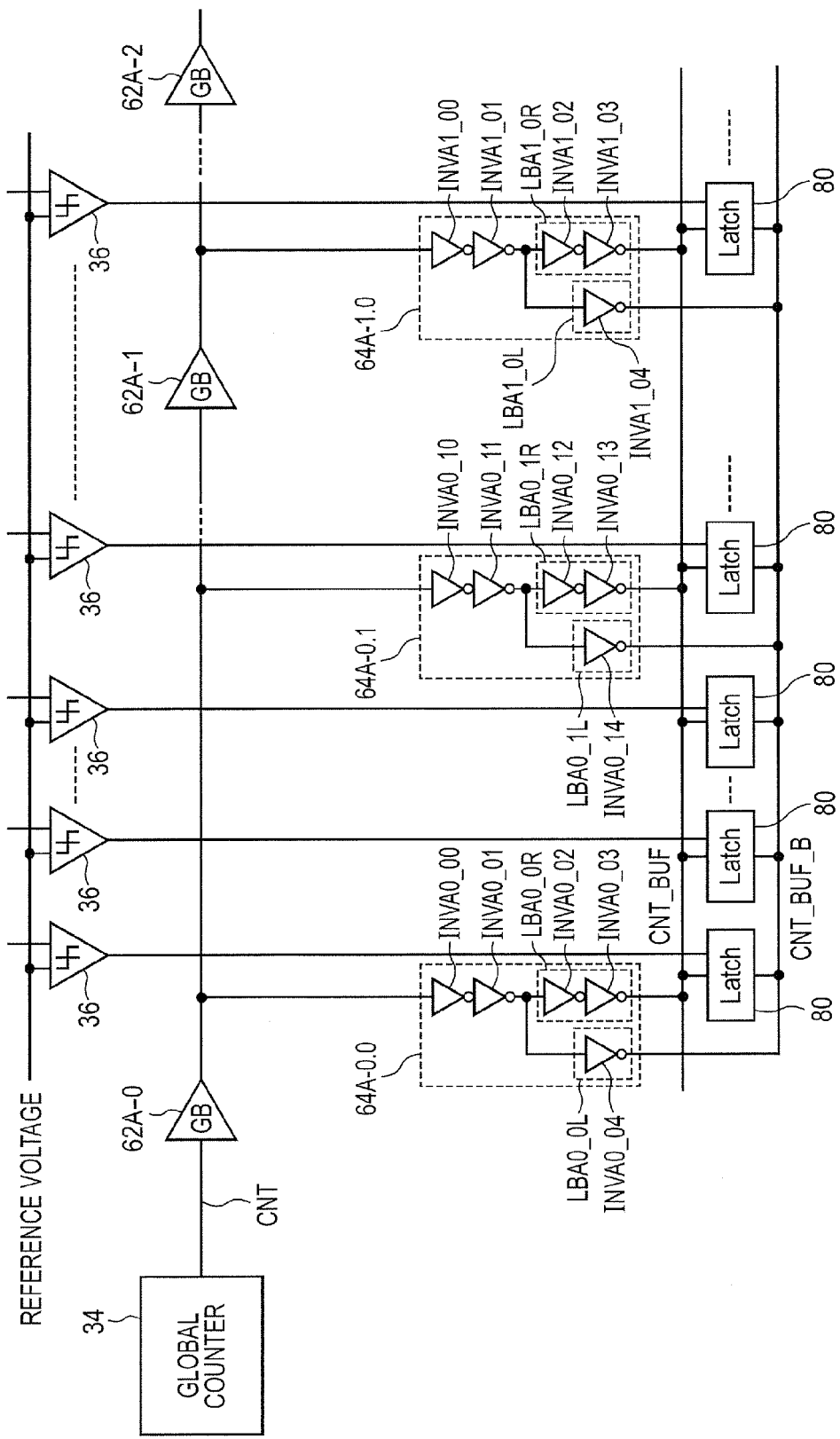
FIG. 14 is a diagram illustrating a signal line path until an output of the counter from the global counter is propagated to the latch circuits according to a first embodiment.

A first embodiment will be described in comparison with the study example of FIG. 10. FIG. 14 is a diagram illustrating a signal line path until an output of the counter from the global counter 34 is propagated to the latch circuits 80 according to the first embodiment.

Referring to FIG. 14, the signal line path of the counter signal CNT, which is an output signal from the global counter 34, is configured by a wiring layer so as to extend along one given direction, and allows the counter signal CNT to be propagated therethrough. The one direction indicates a direction along which the comparators 36 are aligned, a direction along which the column ADCs 12 are aligned, that is, a direction along which the sample and hold circuits 18 are aligned, and a direction along which the latch circuits are aligned.

Global buffer GB62A-0, GB62A-1, GB62A-2, ..., (hereinafter also collectively called "global buffer delay GB62A") for shaping a waveform of the counter signal CNT is arranged on the signal line path. The signal line paths of the local counter signal CNT_BUF and the inversion signal CNT_BUF_B for supplying the counter signal CNT to the latch circuits 80 are branched from the signal line path of the counter signal CNT. The global buffer GB62A may be configured by a repeater without being limited to this configuration.

Also, the trigger signal CMT is supplied to the respective latch circuits 80. The counter signal CNT and the trigger signal CMT are configured by different wiring layers on the semiconductor chip.

Local buffers LB64—0.0, LB64—0.1, ..., LB64—1.0, ..., (hereinafter also collectively called "local buffer LB64A") for driving the local counter signal CNT_BUF and the inversion signal CNT_BUF_B are arranged on the signal line paths branched from the signal line paths of the counter signal CNT. The local buffer LB64 is arranged immediately below or in the vicinity of the signal line path of the counter signal CNT.

In the signal line paths according to the first embodiment, the counter signals CNT_BUF are generated by the respective local buffer LB64A, and the generated respective counter signals CNT_BUF are connected to each other. With this configuration, unlike the study example, the local counter signal CNT_BUF can supply the counter signal CNT to all of the latch circuits 80 as a common signal line. The same configuration is applied to the inversion signal CNT_BUF_B, and therefore its description will not be repeated.

Since the local counter signal CNT_BUF that is the common signal line is supplied to all of the latch circuits 80, influences of the global buffer GB62A and the local buffer LB64A can be minimized, and a difference in the delay time of the counter signal CNT to the adjacent latch circuit 80 is reduced.

Again referring to FIG. 12, as compared with the study example (dotted line), with the configuration of the first embodiment, the counter signal CNT_BUF of all the latch circuits 80 is commonalized, and the counter signal CNT is supplied to the respective latch circuits 80. As a result, the delay time difference in the local counter signal to the adjacent latch circuit 80 is reduced without being affected by the global buffer GB62A and the local buffer LB64A.

More specifically, the configuration of the first embodiment is applied between COL1356 and COL1552 where the delay time difference is about 400 ps, as a result of which the delay time difference can be reduced to 100 ps or lower.

Also, because the fluctuation difference of the local buffer delay time difference similarly occurs about 100 ps or lower, there is a high possibility that a user recognizes that an image not largely displaced from the original brightness is output without uncomfortable feeling.

As described above with reference to FIGS. 12 and 14, all of the latch circuits 80 are supplied with the count value from the commonalized local counter signal CNT_BUF (common signal line). Since the local global signal is commonalized, the global buffer delay time difference is also reduced. Also, the global buffer GB62A is appropriately arranged in whole so that the delay time can be further reduced, and the image with the original brightness can be reproduced.

Second Embodiment

Figure 15:
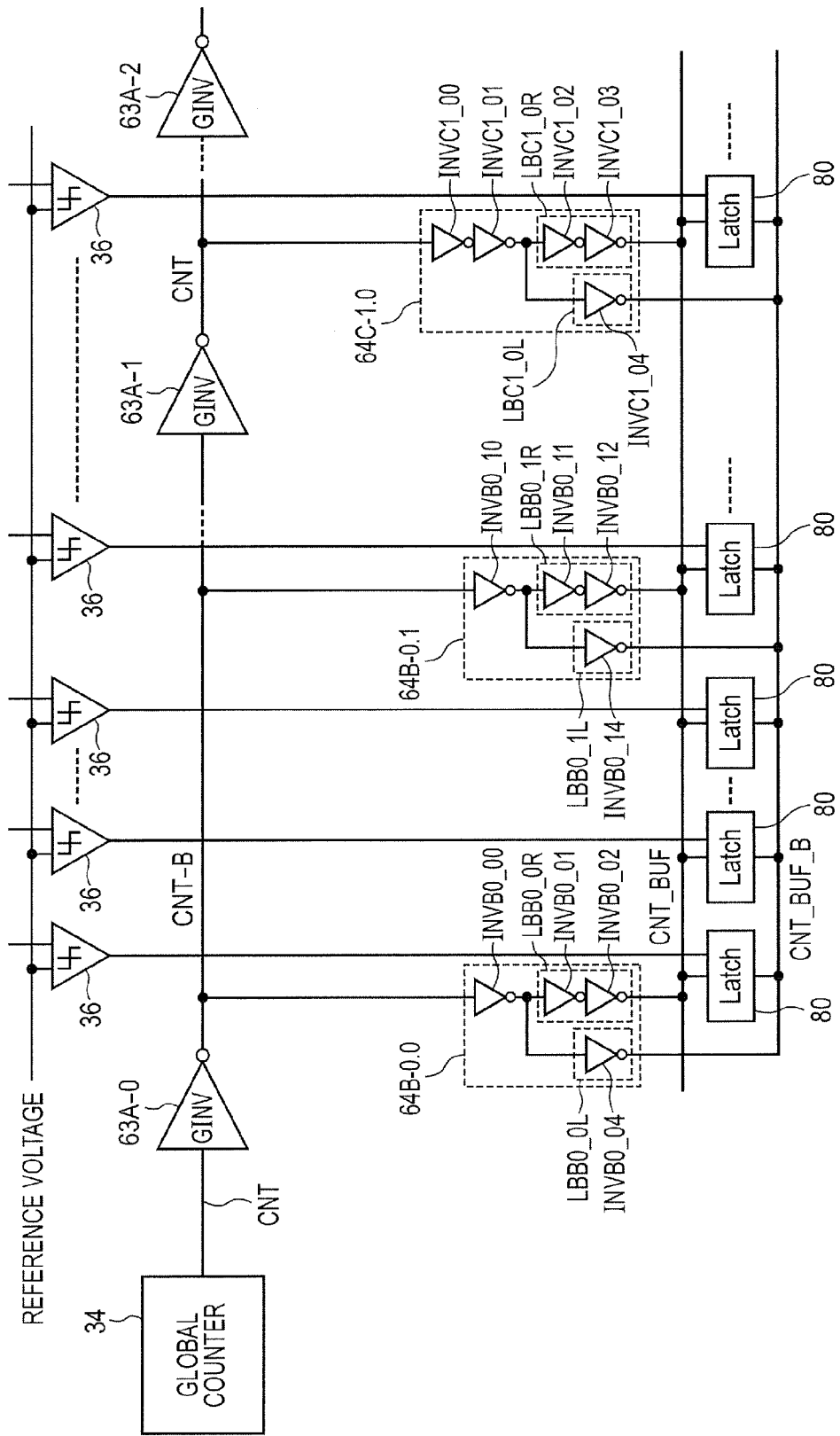
FIG. 15 is a diagram illustrating a signal line path until an output of the counter from the global counter is propagated to the latch circuits according to a second embodiment.

FIG. 15 is a diagram illustrating a signal line path until an output of the counter from the global counter 34 is propagated to the latch circuits 80 according to a second embodiment.

In the first embodiment, the global buffer GB62A of FIG. 14 is arranged on the signal line path of the counter signal CNT. Referring to FIG. 15, in the second embodiment, the global buffers GB62A on the signal line path of the counter signal CNT are replaced with inverters GINV63A-0, GINV63A-1, GINV63A-2, ..., (hereinafter also collectively called "inverter GINV63A") on the signal line path of the counter signal CNT.

Also, the local buffer LB64A of the first embodiment is replaced with local buffers LB64B and LB64C which will be describe later in the second embodiment.

The signal line path of the counter signal CNT, which is an output signal from the global counter 34, is configured by a wiring layer so as to extend along one given direction, and allows the counter signal CNT to be propagated therethrough. The one direction indicates a direction along which the comparators 36 are aligned, a direction along which the column ADCs 12 are aligned, that is, a direction along which the sample and hold circuits 18 are aligned, and a direction along which the latch circuits are aligned.

The inverter GINV63A-0 is arranged on the signal line path for shaping a waveform of the counter signal CNT. The signal line paths of the local counter signal CNT_BUF and the inversion signal CNT_BUF_B for supplying the counter signal CNT to the latch circuits 80 are branched from the signal line path of the counter signal CNT. Also, the trigger signal CMT is supplied to the respective latch circuits 80. The counter signal CNT and the trigger signal CMT are configured by different wiring layers on the semiconductor chip.

Local buffers LB64B—0.0, LB64B—0.1, . . . , LB64C—1.0, . . . , (hereinafter also collectively called "local buffer LB64A" and "local buffer LB64C") for driving the local counter signal CNT_BUF and the inversion signal CNT_BUF_B are arranged on the signal line paths branched from the signal line paths of the counter signal CNT. The local buffers LB64B and LB64C are arranged immediately below or in the vicinity of the signal line path of the counter signal CNT.

The local buffer LB64B—0.0 includes an inverter INVB0_00, a sub local buffer LBB0_0R connected between an output node of the inverter INVB0_00 and a node that supplies the local counter signal CNT_BUF, and a sub local buffer LBB0_0L connected between the output node of the inverter INVB0_00 and a node that supplies the inversion signal CNT_BUF_B of the counter signal.

The sub local buffer LBB0_0R includes inverters INVB0_01 and INVB0_02 connected in series, and the sub local buffer LBB0_0L includes an inverter INVB0_03 of an odd stage. The counter signal CNT_BUF and the inversion signal CNT_BUF_B are generated by the sub local buffers LBB0_0R and LBB0_0L.

The local buffer LB64C—0.0 includes two inverters INVC1_00 and INVC1_01 which are connected in series, a sub local buffer LBC1_0R connected between an output node of the inverter INVC1_01 and a node that supplies the local counter signal CNT_BUF, and a sub local buffer LBC1_0L connected between the output node of the inverter INVC1_01 and a node that supplies the inversion signal CNT_BUF_B of the counter signal.

The sub local buffer LBC1_0R includes inverters INVC1_02 and INVC1_03 of an even stage which are connected in series, and the sub local buffer LBC1_0L includes an inverter INVC1_04 of an odd stage.

The local counter signal CNT_BUF and the inversion signal CNT_BUF_B are generated by the sub local buffers LBC0_0R and LBC1_0L.

An appropriate one of the local buffer LB64B and the local buffer LB64C is selected in correspondence with the input counter signal CNT and inversion signal CNT B to generate the local counter signal CNT_BUF and the inversion signal CNT_BUF_B.

More specifically, the node that supplies the counter signal CNT output from the global counter 34 is connected to the input node of the inverter GINV63A-0, and the inversion signal CNT B is output by the inverter GINV63A-0. The local buffer LB64B is arranged to achieve a consistency of logic until the node that supplies the inversion signal CNT B is connected to the input node of the downstream inverter GINV63A-1.

Likewise, because the logic of the counter signal CNT is a positive logic between the inverter GINV63A-0 and the inverter GINV63A-1, the same local buffer LBC64 as the local buffer LB64 of the first embodiment in FIG. 14 is arranged.

As described above with reference to FIG. 15, all of the latch circuits 80 receive the count value from the commonalized local counter signal CNT_BUF (common signal line). The local global signal is commonalized, and the global buffer GB62 of the first embodiment is replaced with the inverter GINV63A whereby the global buffer delay time difference can be reduced to reproduce the image with the original brightness, and the overall chip is reduced in area.

More specifically, as compared with the first embodiment, an area of one inverter per one global buffer GB62A can be reduced. Because the reduceable inverters are normally arranged on the signal line path of the counter signal CNT, there is a need to increase the drive capability. In order to increase the drive capability, the area of each inverter is also increased. Therefore, if the area is not required, the area of the chip area can be reduced. Also, because such a reduction enables one inverter to be reduced per one global buffer GB62A, if this is applied to the overall chip, the chip area can be efficiently reduced.

Third Embodiment

Figure 16:
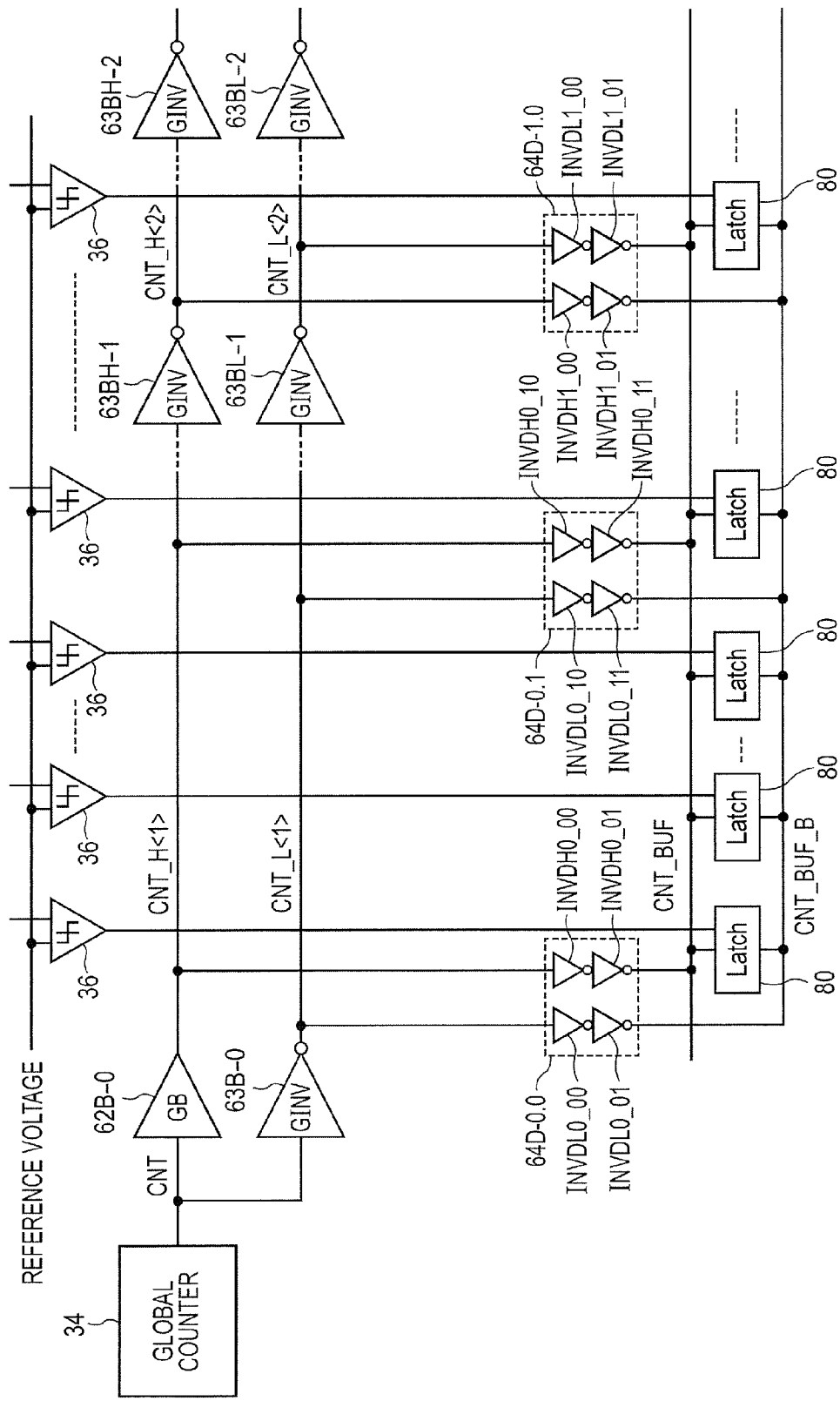
FIG. 16 is a diagram illustrating a signal line path until an output of the counter from the global counter is propagated to the latch circuits according to a third embodiment.

FIG. 16 is a diagram illustrating a signal line path until the output of the counter from the global counter 34 is propagated to the latch circuits 80 according to the third embodiment. The third embodiment will be described in comparison with the first embodiment.

Referring to FIG. 16, the counter signal CNT of the first embodiment is replaced with a counter signal CNT_H, and in addition, an inversion counter signal CNT_L thereof is generated, and the signal line path of the inversion counter signal CNT_L is so arranged to extend along the same direction as that of the signal line path of the counter signal CNT_H.

In the following description, the counter signals CNT_H<i> (i=1, 2, 3, . . . ) and CNT_L<i> (i=1, 2, 3, . . . ) are also collectively called "counter signals CNT_H and CNT_L", respectively.

That is, the signal line path until the output of the counter from the global counter 34 is propagated to the latch circuits 80 includes two signal line paths of the counter signal CNT_H and the inversion signal CNT_L, and signal line paths branched from the counter signal CNT_H and the inversion signal CNT_L, for supplying the output of the counter to the counter signal CNT_BUF which is a common signal line.

The counter signal CNT_H<1> and the inversion signal CNT_L<1> are generated by the global buffer GB62-0 and the inverter GINV63B-0 on the basis of the counter signal CNT from the global counter 34.

Inverters GINV63BH-1, GINV63BH-2, . . . , are arranged on the signal line path of the counter signal CNT_H<1>. Inverters GINV63BL-1, GINV63BL-2, . . . , are arranged on the signal line path of the counter signal CNT_L<1>. Those signal line paths of the counter signal CNT_H and the inversion signal CNT_L are configured by wiring layers so as to extend along one given direction, and allow the counter signal CNT_H (CNT_L) to be propagated therethrough. The one direction indicates a direction along which the comparators 36 are aligned, a direction along which the column ADCs 12 are aligned, that is, a direction along which the sample and hold circuits 18 are aligned, and a direction along which the latch circuits are aligned.

The inverter GINV63B-0 (global buffer GB62B-0) is arranged on the signal line path for shaping a waveform of the counter signal CNT_H (CNT_L). The signal line paths of the local counter signal CNT_BUF and the inversion signal CNT_BUF_B for supplying the counter signal CNT_H (CNT_L) to the latch circuits 80 are branched from the signal line path of the counter signal CNT_H (CNT_L). Also, the trigger signal CMT is supplied to the respective latch circuits

80. The counter signal CNT_H (CNT_L) and the trigger signal CMT are configured by different wiring layers on the semiconductor chip.

The counter signal CNT_H<i> (i=2, 3, . . . ) indicates the output signal of GINV63BH i, and CNT_L<j> (j=1, 2, . . . ) indicates the output signal of GINV63BL j. In this example, CNT_H<1> indicates the output signal from the global buffer GB62-0. Further, the counter signals CNT_H<i> and CNT_L<i> always have a complementary relationship.

Local buffers LB64D—0.0, LB64D—0.1, . . . , LB64D—1.0, . . . , (hereinafter also collectively called "local buffer LB64D") for driving the local counter signal CNT_BUF and the inversion signal CNT_BUF_B are arranged on the signal line paths branched from the signal line paths of the counter signal CNT_H (CNT_L). The local buffers LB64B are arranged immediately below or in the vicinity of the signal line path of the counter signal CNT_H (CNT_L).

In the local buffer LB64D—0.0, inverters INVDL0_00 and INVDL0_01 connected in series are arranged on the signal line path branched from the signal line path of the counter signal CNT_H, and inverters INVDH0_00 and INVDH0_01 connected in series are arranged on the signal line path branched from the signal line path of the counter signal CNT_L.

In this example, as described above, the counter signals CNT_H<i> and CNT_L<i> have a complementary relationship with each other, and the logic of both those signals is inverse between the counter signals CNT_H<i> and CNT_H<i+1>. For that reason, it is important to connect the signal lines branched from the counter signals CNT_H and CNT_L in conformity to the logic with the local counter signals CNT_BUF and CNT_BUF_B.

For example, if the counter signal CNT_H<i> is identical with the logic of the counter signal CNT, the signal line branched from the counter signal CNT_H<i> is connected with the local counter signal CNT_BUF. On the other hand, in the counter signal CNT_L<i> which is logically inverted with respect to the logic of the counter signal CNT, the signal line branched from the counter signal CNT_L<i> is connected to the inversion signal CNT_BUF_B.

Also, when the counter signal CNT_H<i> has the inverse logic of the counter signal CNT, the signal line branched from the counter signal CNT_H<i> is connected to the counter signal CNT_BUF_B. In the counter signal CNT_L<i> which is the logic of the counter signal CNT, the signal line branched from the counter signal CNT_L<i> is connected to the local counter signal CNT_BUF.

The signal lines branched from the counter signals CNT_H and CNT_L are connected to the local counter signals CNT_BUF and CNT_BUF_B while maintain the consistency between the logic of the counter signals CNT_H and CNT_L, and the logic of the local counter signals CNT_BUF and CNT_BUF_B.

The same configuration is applied to the local buffers LB64D—0.1, . . . , LB64D—1.0, and therefore their description will not be repeated.

As described above with reference to FIG. 16, the counter signals CNTT_H and CNT_L, which are complementary signals with each other, are generated on the basis of the counter signal CNT, and the signal lines branched from those counter signals CNT_H and CNT_L are so connected as to maintain the consistency with the logic of the local counter signals CNT_BUF and CNT_BUF_B, which are the common signal lines. With the above configuration, the local buffer LB64D having the same configuration can be used, and the delay time of the counter signal and the man-hour of the layout can be reduced.

Fourth Embodiment

Figure 17:
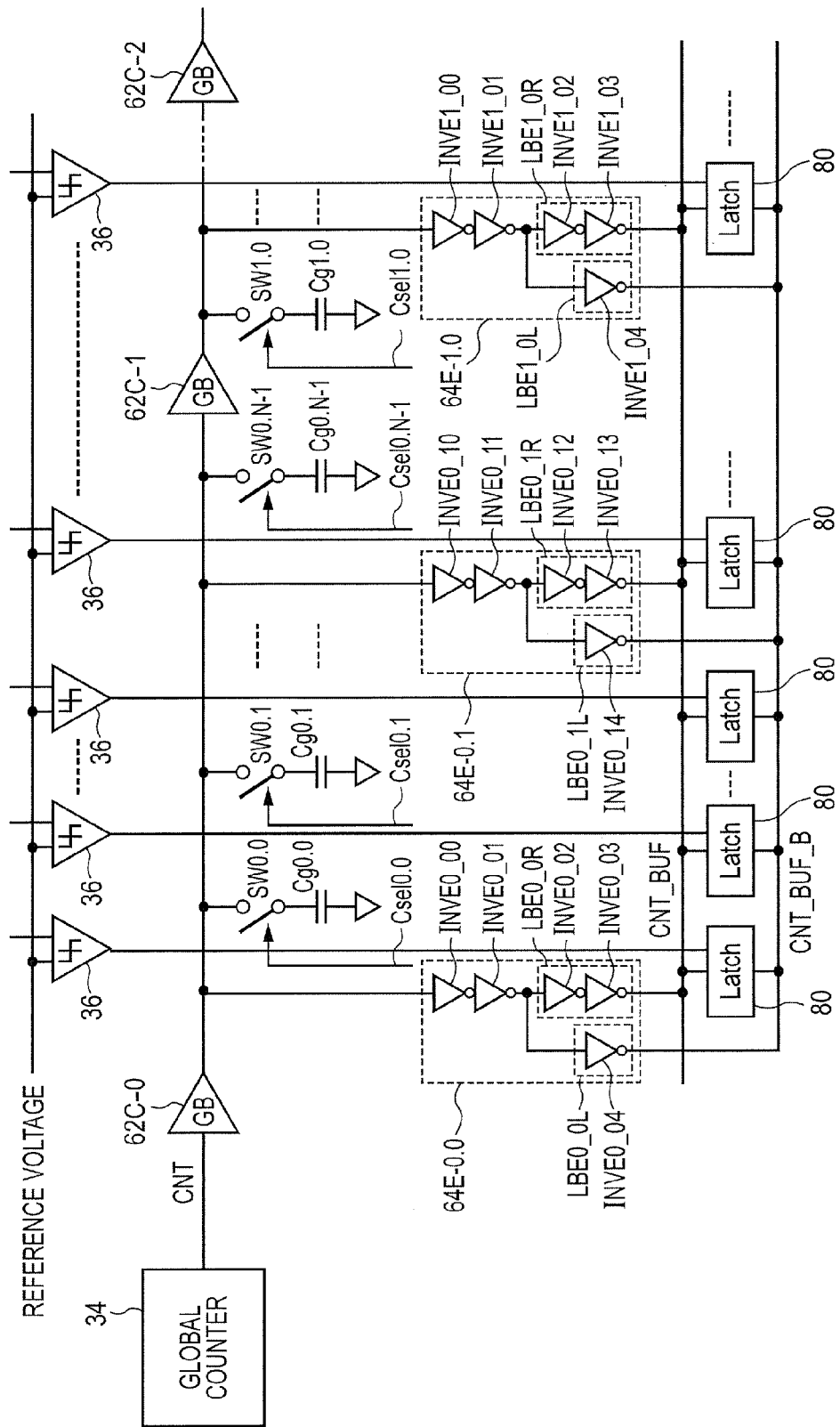
FIG. 17 is a diagram illustrating a signal line path until an output of the counter from the global counter is propagated to the latch circuits according to a fourth embodiment.

FIG. 17 is a diagram illustrating a signal line path until an output of the counter from the global counter 34 is propagated to the latch circuits 80 according to a fourth embodiment. The fourth embodiment will be described in comparison with the first embodiment.

Referring to FIG. 17, in the signal line path according to the fourth embodiment, in addition to the configuration of the signal line path according to the first embodiment, MOS switches SW0.0, SW0.1, . . . and corresponding capacitors Cg0.0, Cg0.1, . . . are disposed on the signal line paths branched from the signal line path of the counter signal CNT. Hereinafter, the MOS switches SW0.0, SW0.1, . . . are also collectively called "MOS switch SW", and the capacitors Cg0.0, Cg0.1, . . . are also collectively called "capacitor Cg".

The signal line path of the counter signal CNT, which is an output signal from the global counter 34, is configured by a wiring layer so as to extend along one given direction, and allows the counter signal CNT to be propagated therethrough. The one direction indicates a direction along which the comparators 36 are aligned, a direction along which the column ADCs 12 are aligned, that is, a direction along which the sample and hold circuits 18 are aligned, and a direction along which the latch circuits are aligned.

A global buffer GB62C-0 is arranged on the signal line path for shaping a waveform of the counter signal CNT. The signal line paths of the local counter signal CNT_BUF and the inversion signal CNT_BUF_B for supplying the counter signal CNT to the latch circuits 80 are branched from the signal line path of the counter signal CNT.

Local buffers LB64E—0.0, LB64E—0.1, . . . , LB64E—1.0, . . . , (hereinafter also collectively called "local buffer LB64E") for driving the local counter signal CNT_BUF and the inversion signal CNT_BUF_B are arranged on the signal line paths branched from the signal line paths of the counter signal CNT. The local buffers LB64E are arranged immediately below or in the vicinity of the signal line path of the counter signal CNT.

The respective MOS switches SW are controlled according to control signals Csel0, Csel1, . . . , Cseln (hereinafter, Csel0, Csel1, . . . , Cseln are also collectively called "control signal Csel". The one/off states of the MOS switches SW are combined, individually, according to the corresponding control signals Csel0, Csel1, . . . , Cseln, by the control circuit 24, so as to adjust the delay time of the counter signal CNT.

For example, the ramp waveforms of the ADCs 12, and the delay times of the counter signal are made identical with each other so that the delay time difference of the adjacent latch circuit 80 can be adjusted. Specifically, again referring to FIG. 13, the local counter signal CNT_BUF<P> is delayed with a time TA by using the capacitor Cg to synchronize with the output of the local counter signal CNT_BUF<P+1>. As a result, the image data of the original brightness is output.

As described above with reference to FIG. 17, the MOS switch SW controlled by the control circuit 24 and the corresponding capacitor Cg are provided on the signal line path of the counter signal CNT so that the delay time of the local counter signal can be adjusted. As a result, because the delay time differences among all of the latch circuits 80 can be eliminated, an image having brightness close to the original brightness can be output.

Fifth Embodiment

Figure 18A:
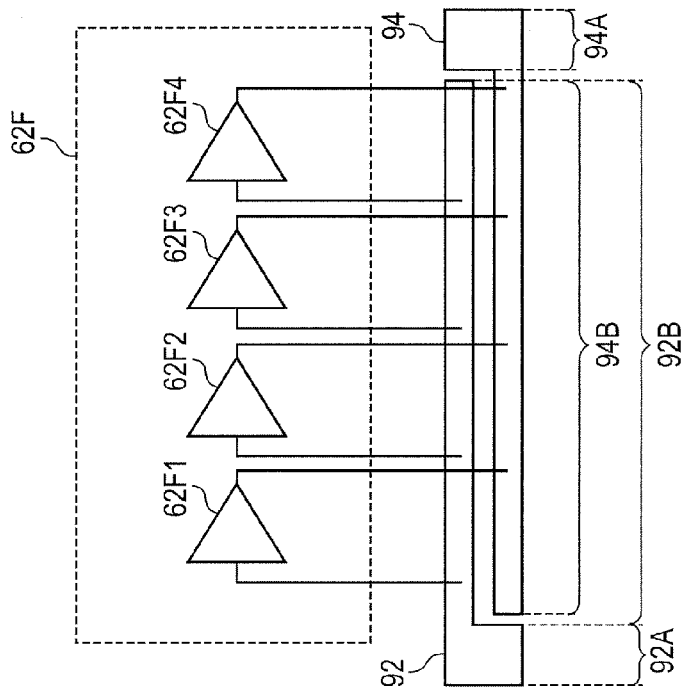
FIGS. 18A and 18B are diagrams illustrating an outline of a layout of a global buffer.
Figure 18B:
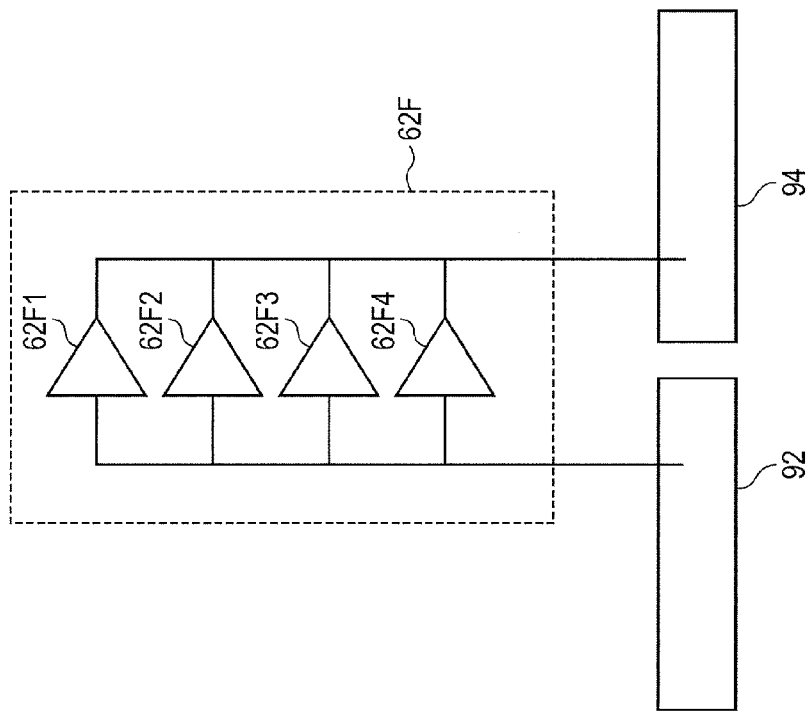

FIGS. 18A and 18B are diagrams illustrating an outline of a layout of a global buffer GB62F. As illustrated in FIGS. 2 and 18A, the global buffer GB62F is disposed on the signal line path of the counter signal CNT which propagates the output of the global counter 34.

The global buffer GB62F includes a plurality of sub buffer circuits 62F1 to 62F4. The sub buffer circuits 62F1 to 62F4 are connected in parallel between the same input signal 92 and output signal 94, and arranged in a vertical direction to the wiring direction. In this arrangement, pitches of the plural wirings of the counter signal CNT cannot be narrowed.

On the other hand, as illustrated in FIG. 18B, the wirings of the input signal 92 and the output signal 94 of the global buffer GB62F are partially deformed to face each other, and the sub buffer circuits 62F1 to 62F4 are dispersed in parallel so that the wiring pitches of the counter signals CNT can be narrowed.

As described above with reference to FIGS. 18A and 18B, the respective wirings of the input and output of the global buffer GB62F are partially narrowed to face each other and dispersed. As a result, the number of buffer circuits is increased so that the pitches of the wirings of the counter signal CNT can be narrowed, the delay time difference can be further reduced, and pitches of the pixels can also be narrowed.

Further, if the fifth embodiment is combined with the first to fourth embodiments, the chip area of the solid-state image pickup device can be reduced to perform high-speed processing.

The embodiments of the invention disclosed this time should be considered to be exemplary in all respects and not limitative. The scope of the invention is not defined by the foregoing description but by the claims. The invention is intended to include all the modifications that are equivalent in significance and scope to the claims.

What is claimed is:

1. A solid-state image pickup device comprising:
a plurality of pixels;
a voltage generator that generates a reference voltage;
a plurality of comparators that are aligned in one direction, and compare respective voltages output from the pixels with the reference voltage;
a counter that counts in tandem with a change in the reference voltage generated by the voltage generator;
a plurality of buffer circuits that are connected in series with the counter, and each sequentially receives an output of the counter;
a plurality of latch circuits that take in a value input to an input terminal thereof according to respective trigger signals output from the comparators;
a common signal line that is commonly connected to respective inputs of the latch circuits; and
a plurality of signal lines that are connected to respective outputs of the buffer circuits, and allow the output of the counter to propagate therethrough,
wherein each of the signal lines includes a first signal line path that is arranged to extend along the one direction, and propagates the output of the counter, and a second signal line path that is branched from the first signal line path for supplying the output of the counter to the common signal line.

2. The solid-state image pickup device according to claim 1, further comprising a plurality of sub buffer circuits that receive a signal on the second signal line path, and drive the common signal line.

3. The solid-state image pickup device according to claim 2,
wherein each of the sub buffer circuits outputs complementary signals that are complementary with each other,
wherein the common signal line is driven by one of the complementary signals, and
wherein the solid-state image pickup device further includes another signal line that transmits the other complementary signal to the latch circuits.

4. The solid-state image pickup device according to claim 3,
wherein each of the sub buffer circuits includes first and second sub local buffer circuits that generate the complementary signals.

5. The solid-state image pickup device according to claim 4,
wherein the first sub local buffer circuit has an odd number of inverter circuits, and
wherein the second sub local buffer circuit has an even number of inverter circuits.

6. The solid-state image pickup device according to claim 1,
wherein the plurality of buffer circuits are connected in series, and include a plurality of inverters that sequentially propagate the output of the counter.

7. The solid-state image pickup device according to claim 1, further comprising:
a plurality of switch circuits that are dispersed and connected on wiring of a path that transmits the outputs of the counters of the buffer circuits; and
a plurality of capacitors that are connected between the switch circuits and the ground node,
wherein each of the switch circuits is controlled according to a control signal that is controllable for each of the switch circuits.

8. The solid-state image pickup device according to claim 1,
wherein each of the buffer circuits includes a waveform shaping portion that shapes a waveform of the counter output, and first and second wirings connected to an input and an output of the waveform shaping portion, respectively,
wherein the first wiring includes a first portion having a first width, and a second portion having a width smaller than the first width, and connected to the first portion,
wherein the second wiring includes a third portion having the first width, and a fourth portion having a width smaller than the first width, and connected to the third portion, and
wherein the second portion and the fourth portion are arranged to face each other, and the waveform shaping portion is connected between the second portion and the fourth portion.

* * * * *